US012581643B2

(12) United States Patent
Seo et al.

(10) Patent No.: US 12,581,643 B2
(45) Date of Patent: Mar. 17, 2026

(54) SEMICONDUCTOR MEMORY DEVICE AND METHOD FOR FABRICATING THE SAME

(71) Applicant: SAMSUNG ELECTRONICS CO., LTD., Suwon-si (KR)

(72) Inventors: Chang Woo Seo, Suwon-si (KR); Hyun-Chul Shim, Suwon-si (KR); Da In Lee, Suwon-si (KR); Su Youn Song, Suwon-si (KR); Jeong Eun Song, Suwon-si (KR); Won Seok Yoo, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 483 days.

(21) Appl. No.: 18/317,201

(22) Filed: May 15, 2023

(65) Prior Publication Data

US 2023/0284439 A1 Sep. 7, 2023

(30) Foreign Application Priority Data

Aug. 2, 2022 (KR) ........................ 10-2022-0096205

(51) Int. Cl.
*H10B 12/00* (2023.01)

(52) U.S. Cl.
CPC .......... *H10B 12/485* (2023.02); *H10B 12/02* (2023.02); *H10B 12/315* (2023.02); *H10B 12/482* (2023.02)

(58) Field of Classification Search
CPC ............................ H10B 12/315; H10B 12/482
See application file for complete search history.

(56) References Cited

U.S. PATENT DOCUMENTS

| | | | |
|---|---|---|---|
| 10,546,810 B2 | 1/2020 | Park | |
| 10,644,008 B2 * | 5/2020 | Lee ................... | H01L 21/31116 |
| 10,847,519 B2 | 11/2020 | Ji et al. | |
| 11,177,215 B2 | 11/2021 | Park et al. | |
| 2017/0005166 A1 * | 1/2017 | Park ..................... | H10D 62/115 |
| 2020/0066729 A1 * | 2/2020 | Simsek-Ege ......... | H10B 12/482 |

(Continued)

FOREIGN PATENT DOCUMENTS

| | | |
|---|---|---|
| TW | I762156 B | 4/2022 |

OTHER PUBLICATIONS

Office Action dated Aug. 29, 2024 in corresponding Taiwan Patent Application No. TW 112126992, in Chinese, 2 pages.

*Primary Examiner* — Steven M Page
(74) *Attorney, Agent, or Firm* — MORGAN, LEWIS & BOCKIUS LLP

(57) ABSTRACT

A semiconductor memory device includes a substrate including a trench and a contact recess, a direct contact placed inside the trench and having a width smaller than a width of the trench, a bit line structure placed on the direct contact and having a width smaller than the width of the trench, a spacer structure placed on side surfaces of the direct contact and the bit line structure, and a buried contact spaced apart from the direct contact and the bit line structure by the spacer structure and filling the contact recess. The spacer structure includes an oxide film placed between the direct contact and the buried contact inside the trench, a seed layer placed on the oxide film inside the trench between the direct contact and the buried contact, and a bulk layer filling the trench on the seed layer and including silicon nitride. The seed layer includes carbon.

20 Claims, 22 Drawing Sheets

(56)             References Cited

U.S. PATENT DOCUMENTS

| | | | | |
|---|---|---|---|---|
| 2020/0203354 | A1* | 6/2020 | Lee | H10B 12/02 |
| 2021/0066200 | A1* | 3/2021 | Park | H10B 12/34 |
| 2022/0059543 | A1* | 2/2022 | Mun | H10B 12/0335 |
| 2022/0093387 | A1 | 3/2022 | Lee et al. | |
| 2022/0102528 | A1* | 3/2022 | Kim | H10B 12/315 |
| 2022/0262731 | A1* | 8/2022 | Park | H10B 12/315 |

\* cited by examiner

SEMICONDUCTOR MEMORY DEVICE AND METHOD FOR FABRICATING THE SAME

CROSS-REFERENCE TO RELATED APPLICATION(S)

This application claims priority under 35 U.S.C. § 119 to Korean Patent Application No. 10-2022-0096205, filed on Aug. 2, 2022, in the Korean Intellectual Property Office, the contents of which are herein incorporated by reference in their entirety.

TECHNICAL FIELD

The present invention relates to a semiconductor memory device and a method for fabricating the same.

DISCUSSION OF RELATED ART

As semiconductor elements gradually become highly integrated, individual circuit patterns are further miniaturized to implement more semiconductor elements in the same area. That is, as the degree of integration of semiconductor elements increases, design rules for components of the semiconductor elements decrease. Accordingly, the space between adjacent components may become smaller and more limited.

In highly scaled semiconductor elements, a process of forming a plurality of wiring lines with a plurality of buried contacts (BC) and a plurality of direct contacts (DC) interposed between them becomes increasingly complex and difficult. With limited space between adjacent buried contacts (BC) and direct contacts (DC) in the highly scaled semiconductor elements, if the separation distance between the adjacent buried contacts (BC) and direct contacts (DC) is shortened, electrical connection may occur when a voltage is applied even no direct physical contact between them, which can lead to a deterioration in reliability of the semiconductor elements. Therefore, it is desirable to secure a proper separation distance between adjacent contacts in the highly scaled semiconductor elements.

SUMMARY

Embodiments of the present invention provide a semiconductor memory device having enhanced product reliability.

Embodiments of the present invention also provide a method for fabricating the semiconductor memory device capable of fabricating a semiconductor memory device having enhanced product reliability.

According to an embodiment of the present invention, there is provided a semiconductor memory device including a substrate including a trench and a contact recess, a direct contact which is placed inside the trench, and has a width smaller than a width of the trench, a bit line structure which is placed on the direct contact, and has a width smaller than the width of the trench, a spacer structure which is placed on side surfaces of the direct contact and the bit line structure and a buried contact which is spaced apart from the direct contact and the bit line structure by the spacer structure, and fills the contact recess, in which the spacer structure includes an oxide film which is placed between the direct contact and the buried contact inside the trench, a seed layer which is placed on the oxide film and placed inside the trench between the direct contact and the buried contact, and a bulk layer which fills the trench on the seed layer, and includes silicon nitride, in which the seed layer includes carbon.

According to an embodiment of the present invention, there is provided a semiconductor memory device including a substrate including a trench and a contact recess, a direct contact which is placed inside the trench and has a width smaller than a width of the trench; a bit line structure which is placed on the direct contact, and has a width smaller than the width of the trench; a spacer structure which is placed on side surfaces of the direct contact and the bit line structure; and a buried contact which is spaced apart from the direct contact and the bit line structure by the spacer structure, and fills the contact recess, in which the spacer structure includes an inner spacer extending along the side surfaces of the direct contact and the bit line structure and a profile of the trench, an outer spacer extending along a side surface of the inner spacer, and a lower spacer which is placed between the inner spacer and the outer spacer below the outer spacer, and fills the trench, in which the lower spacer includes an oxide film, and a nitride film which is placed on the oxide film and includes carbon.

According to an embodiment of the present invention, there is provided a semiconductor memory device including a substrate including a trench and a contact recess, a direct contact which is placed inside the trench and has a width smaller than a width of the trench, a bit line structure which is placed on the direct contact, and has a width smaller than the width of the trench, a spacer structure which is placed on side surfaces of the direct contact and the bit line structure; and a buried contact which is spaced apart from the direct contact and the bit line structure by the spacer structure, and fills the contact recess, in which the spacer structure includes a first spacer which extends along the side surfaces of the direct contact and the bit line structure and a profile of the trench, an oxide film which is placed on the first spacer inside the trench and placed between the direct contact and the buried contact, a seed layer which is placed on the oxide film and includes carbon, a bulk layer which fills the trench on the seed layer, and includes silicon nitride, and a second spacer which extends along a side surface of the first spacer, and is placed on the oxide film, the seed layer, and the bulk layer, in which the seed layer and the bulk layer are placed between the direct contact and the buried contact, and not placed between the bit line structure placed on the direct contact and the buried contact, in which the seed layer includes a first portion which extends along a profile of the side surface of the direct contact, and a second portion which is bent from the first portion and extends along the profile of the trench, and in which the buried contact is not in contact with the first portion of the seed layer, and is in contact with the second portion of the seed layer.

According to an embodiment of the present invention, there is provided a method for fabricating a semiconductor memory device, the method including forming a trench on a substrate, forming a conductive pattern extending above the substrate, inside the trench, sequentially forming a first silicon nitride film and a silicon oxide film on the trench and the conductive pattern, forming a seed layer including carbon on the silicon oxide film, forming a second silicon nitride film which fills the trench, on the seed layer, forming a spacer placed on side walls of the conductive pattern, on the second silicon nitride film, forming a contact recess connected to the trench, on the substrate and forming a buried contact that fills the contact recess, in which the forming of the seed layer includes providing a precursor including hexachlorodisilane (HCD), a first reactant gas containing $C_2H_4$ and a second reactant gas containing $NH_3$, onto the silicon oxide film, and in which the forming of the second silicon nitride film includes providing a precursor including dichlorosilane (DCS) and an $NH_3$ reactant gas, onto the seed layer.

BRIEF DESCRIPTION OF THE DRAWINGS

The above and other aspects and features of the present invention will become more apparent by describing in detail exemplary embodiments thereof with reference to the accompanying drawings, in which:

FIGS. 13 to 22 are intermediate stage diagrams for explaining a method for fabricating a semiconductor memory device according to an embodiment of the present invention.

Figure 1:
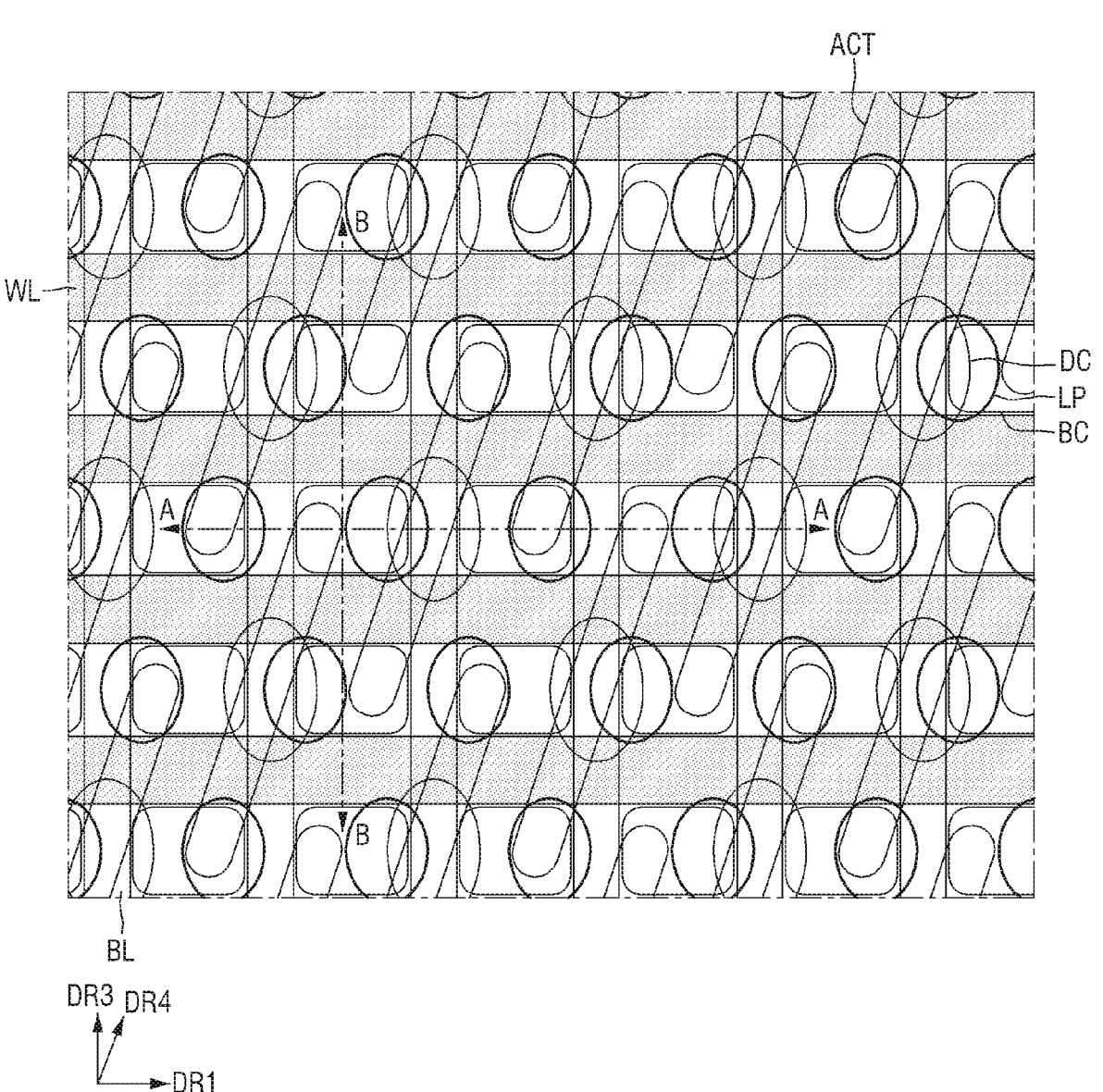
FIG. 1 is a schematic layout diagram for explaining a semiconductor memory device according to an embodiment of the present invention.

Since the drawings in FIGS. 1-22 are intended for illustrative purposes, the elements in the drawings are not necessarily drawn to scale. For example, some of the elements may be enlarged or exaggerated for clarity purpose.

DETAILED DESCRIPTION OF THE EMBODIMENTS

Hereinafter, embodiments of the present invention will be described with reference to the accompanying drawings.

Figure 2:
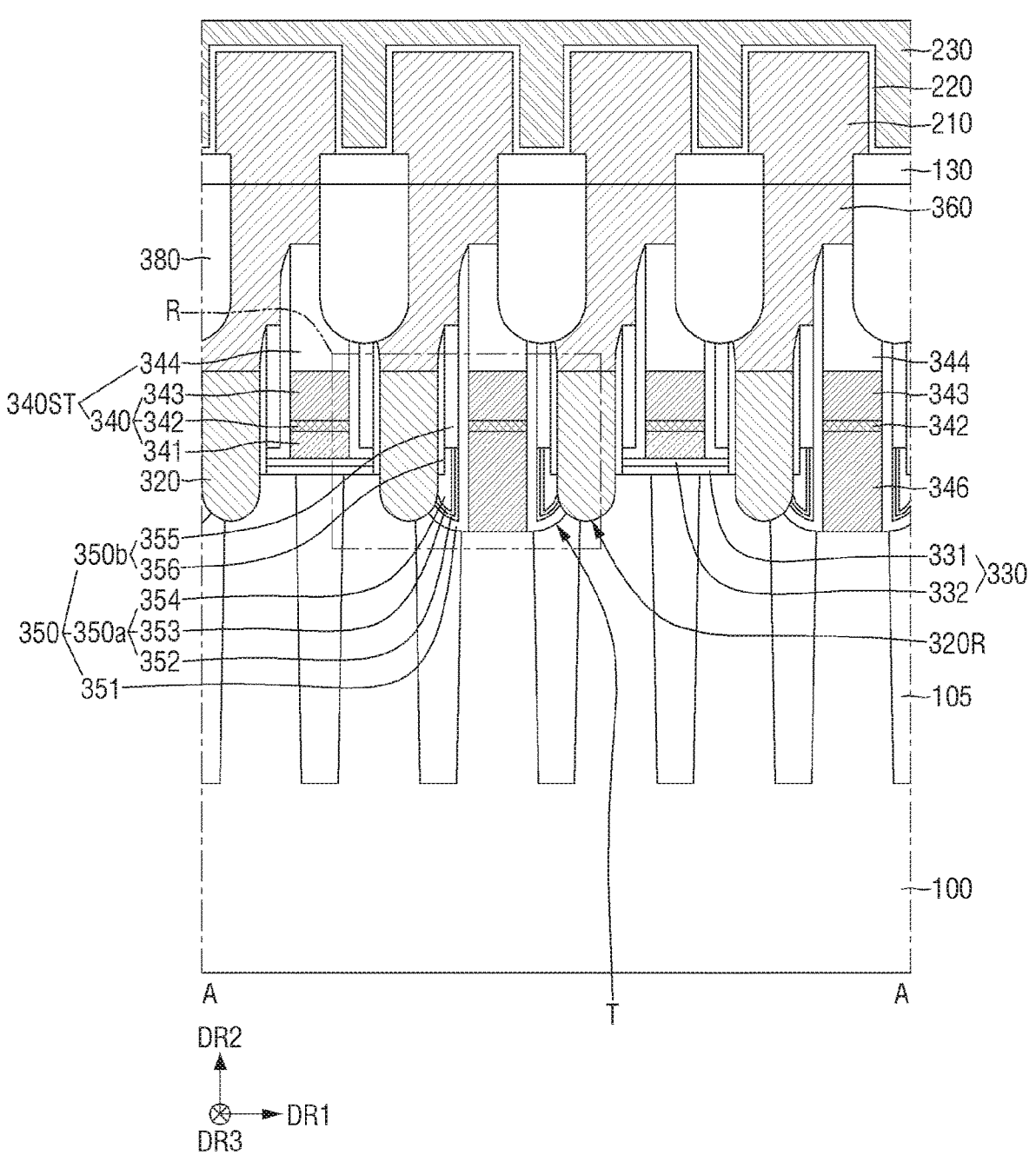
FIG. 2 is a cross-sectional view taken along line A-A of FIG. 1.
Figure 3:
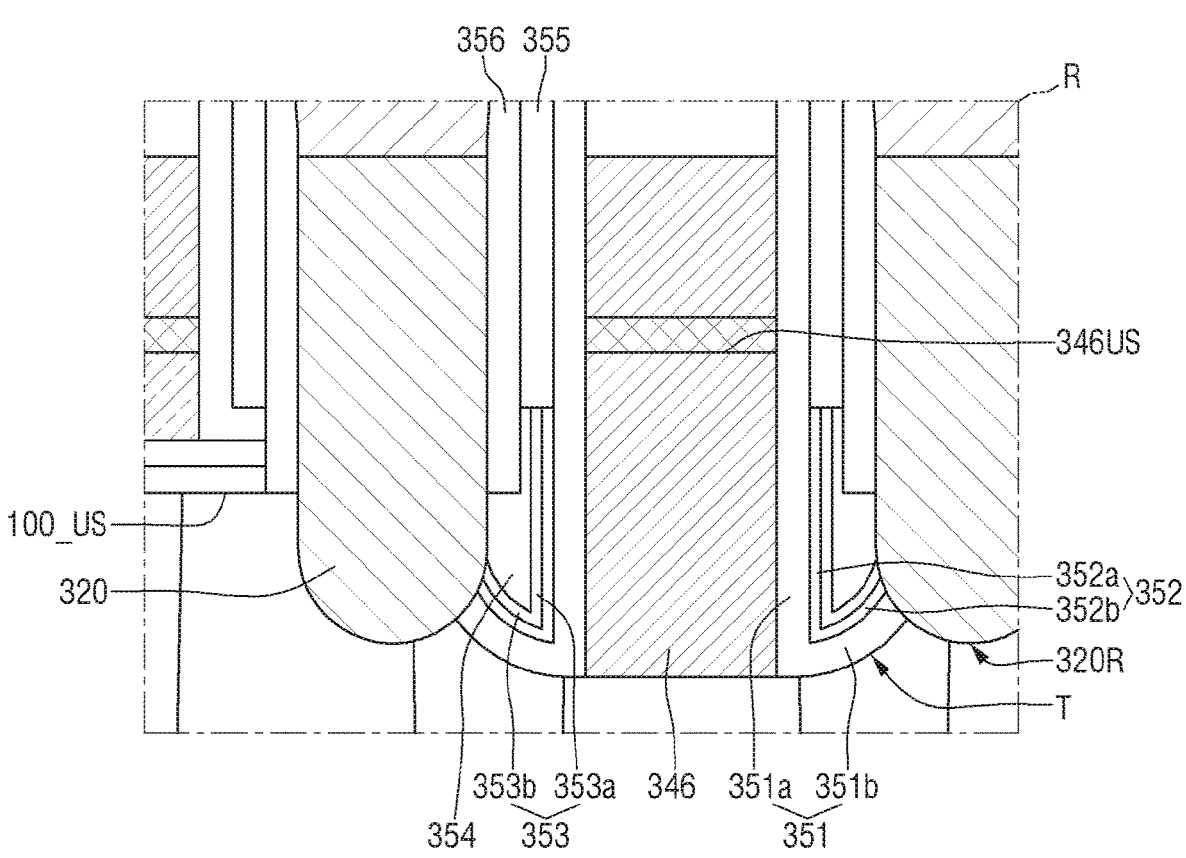
FIGS. 3 and 4 are enlarged views showing portion R of FIG. 2.
Figure 4:
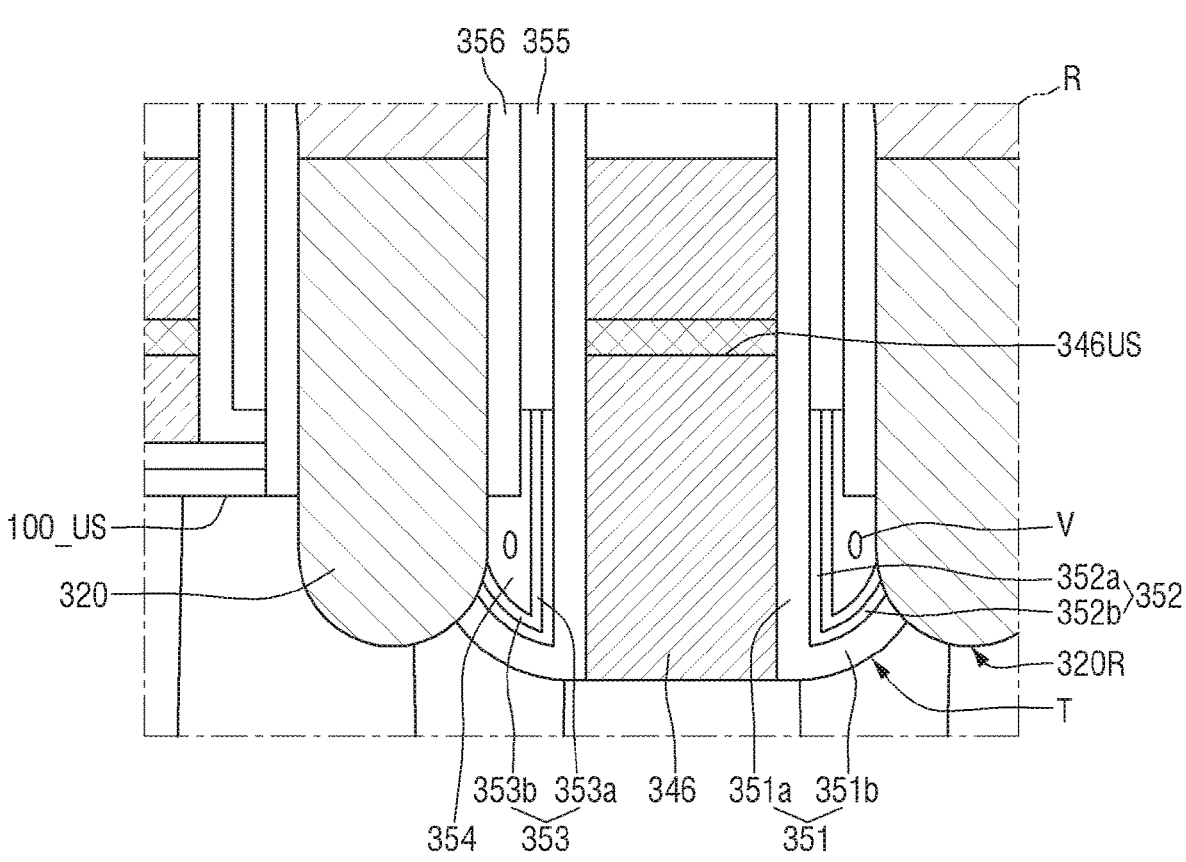
Figure 5:
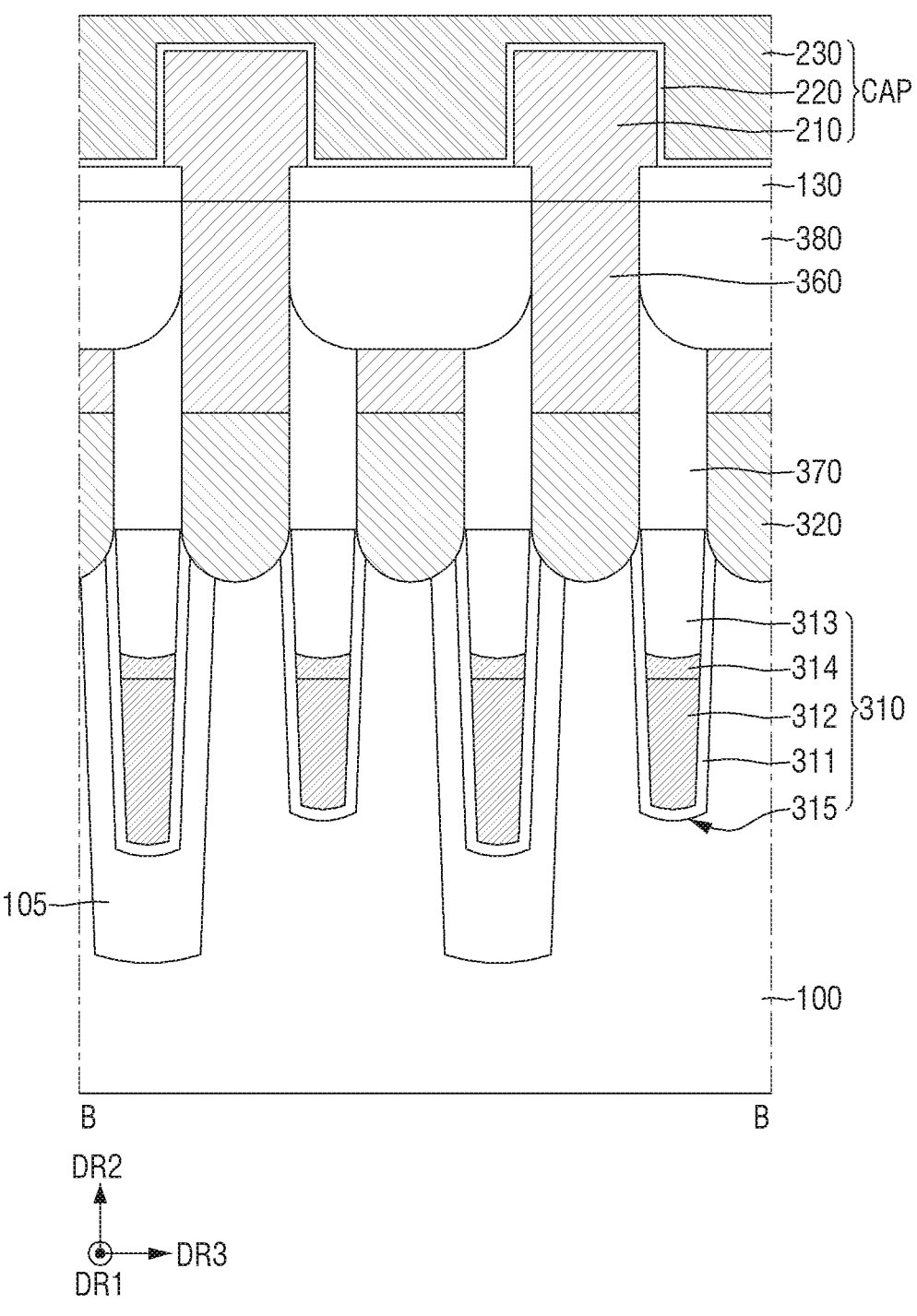
FIG. 5 is a cross-sectional view taken along line B-B of FIG. 1.

FIG. 1 is a schematic layout diagram for explaining a semiconductor memory device according to an embodiment of the present invention. FIG. 2 is a cross-sectional view taken along line A-A of FIG. 1. FIGS. 3 and 4 are enlarged views showing portion R of FIG. 2. FIG. 5 is a cross-sectional view taken along line B-B of FIG. 1.

For reference, although FIG. 1 shows an exemplary layout diagram of a dynamic random access memory (DRAM) except a capacitor, the present invention is not limited thereto.

Referring to FIG. 1, the semiconductor memory device according to an embodiment of the present invention may include a plurality of active regions ACT. The active region ACT may be defined by an element isolation film (105 of FIG. 2) formed inside the substrate (100 of FIG. 2). When viewed in plan, the active regions ACT may correspond to portions of the substrate 100 that are surrounded by the element isolation film (105 of FIG. 2).

As the design rule of the semiconductor memory device decreases, the active region ACT may be placed in the form of a bar of a diagonal line or an oblique line, as shown. The active region ACT may have a bar shape extending in a fourth direction DR4. The active regions ACT may be arranged in parallel to each other such that one of the active regions ACT may have an end portion adjacent to a central portion of a neighboring one of the active regions ACT.

A plurality of gate electrodes may be placed on the active region ACT and extending in a first direction DR1 across the active region ACT. The plurality of gate electrodes may extend to be parallel to each other. The plurality of gate electrodes may be, for example, a plurality of word lines WL.

The word lines WL may be placed at regular intervals. A width of the word lines WL or an interval between the word lines WL may be determined depending on design rules. For example, the word lines WL may run across the active regions ACT, and may be disposed within grooves (gate trench 315 of FIG. 5) formed in the element isolation film (105 of FIG. 2) and the active regions ACT. The grooves may have floors that are relatively deeper in the element isolation film (105 of FIG. 2) and relatively shallower in the active regions ACT (see FIG. 5).

A plurality of bit lines BL extending in a third direction DR3 orthogonal to the word lines WL may be placed on the word lines WL. The plurality of bit lines BL may extend to be parallel to each other.

The bit lines BL may be placed at regular intervals. A width of the bit lines BL or an interval between the bit lines BL may be determined depending on design rules.

A semiconductor memory device according to an embodiment of the present invention may include various contact arrangements formed on the active region ACT. Various contact arrangements may include, for example, a direct contact (DC), a buried contact (BC), a landing pad (LP), and the like.

Here, the direct contact DC may mean a contact that electrically connects the active region ACT to the bit line BL. The buried contact BC may mean a contact that connects the active region ACT to a lower electrode (210 of FIG. 2) of the capacitor. The buried contacts BC may each be disposed between a pair of neighboring bit lines BL in a plan view, and may be spaced apart from each other in the first direction DR1. In addition, the buried contacts BC may each be disposed between a pair of neighboring word lines WL in a plan view, and may be spaced apart from each other in the third direction DR3.

Due to the placement structure, a contact area between the buried contact BC and the active region ACT may be small. Therefore, a conductive landing pad LP may be introduced to enlarge the contact area with the active region ACT and enlarge the contact area with the lower electrode (210 of FIG. 2) of the capacitor.

The landing pad LP may be placed between the active region ACT and the buried contact BC, or may be placed between the buried contact BC and the lower electrode of the capacitor. The landing pad LP may be electrically connected to the buried contact BC. By enlarging the contact area through the introduction of the landing pad LP, the contact resistance between the active region ACT and the capacitor lower electrode may decrease.

In the semiconductor memory device according to an embodiment of the present invention, the direct contact DC may be placed in a central portion of the active region ACT. The buried contact BC may be placed at both ends of the active region ACT.

Since the buried contacts BC are placed at both ends of the active region ACT, the landing pads LP may be placed adjacent to both ends of the active region ACT to partially overlap the buried contacts BC.

The buried contact BC may be formed to overlap the active region ACT and the element isolation film (105 of FIG. 2) between the adjacent word line WL and between the adjacent bit line BL.

The word lines WL may be formed in a structure buried inside the substrate 100. The word line WL may be placed across the active region ACT between the direct contact DC and the buried contact BC.

As shown, two word lines WL may be placed across one active region ACT. Since the active regions ACT is placed obliquely, the word lines WL may have an angle less than 90 degrees with the active region ACT. For example, the bit lines BL extending in the third direction DR3 may be orthogonal to the word lines WL extending in the first direction DR1, while the active region ACT may have a bar shape extending in the fourth direction DR4, and thus, as shown in FIG. 1, the fourth direction DR4 may be inclined by a predetermined angle with respect to the first direction DR1 or the third direction DR3. The predetermined angle may vary to some degree. In an embodiment of the present invention, the predetermined angle may range from about 10° to about 80°.

The buried contacts BC may be placed symmetrically. Therefore, the buried contacts BC may be placed on a straight line along the first direction DR1 and the third direction DR3.

Unlike the buried contacts BC, the landing pads LP may be placed in zigzags in the third direction DR3 in which the bit lines BL extend. Also, the landing pad LP may be placed to overlap the same side surface portion of each bit line BL in the first direction DR1 in which the word lines WL extend.

Each of the landing pads LP of a first line may overlap a left side surface of the corresponding bit line BL, and each of the landing pads LP of a second line may overlap a right side surface of the corresponding bit line BL.

Referring to FIGS. 1 to 5, the semiconductor memory device according to an embodiment of the present invention may include a gate structure 310, a plurality of bit line structures 340ST, a buried contact 320, and a capacitor CAP.

The element isolation film 105 may be formed inside the substrate 100. The element isolation film 105 may have an STI (shallow trench isolation) structure with excellent element isolation characteristics. The element isolation film 105 may define the active region ACT on the substrate 100.

The active region ACT defined by the element isolation film 105 may have a long island shape including a minor axis and a major axis, as shown in FIG. 1. The active region ACT may have a form of an oblique line to have an angle less than 90 degrees with respect to the word line WL formed inside the element isolation film 105. By depositing the plurality of active regions AC in a direction of a diagonal line or an oblique line, a maximum possible distance between contacts may be provided for the semiconductor memory device.

The element isolation film 105 may include, for example, but not limited to, at least one of a silicon oxide ($SiO_2$) film, a silicon nitride ($Si_3N_4$) film, or a silicon oxynitride (SiON) film. Although the element isolation film 105 is shown as being formed as a single insulating film, this is merely for convenience of explanation, and the present invention is not limited thereto. Depending on the width of the element isolation film 105, the element isolation film 105 may be formed by a single insulating film or may be formed by a plurality of insulating films.

The active region ACT may have an oblique line shape to have an angle less than 90 degrees with respect to the bit line BL formed on the element isolation film 105. That is, the active region ACT may extend in a fourth direction DR4 having a predetermined angle with respect to the first direction DR1 and the third direction DR3. For example, the predetermined angle may range from about 10° to about 80°.

The gate structure 310 may be formed inside the substrate 100 and the element isolation film 105. The gate structure 310 may be formed across the element isolation film 105 and the active region ACT defined by the element isolation film 105. The gate structure 310 may include a gate trench 315, a gate insulating film 311, a gate electrode 312, a gate capping pattern 313 and a gate capping conductive film 314 which are formed inside the substrate 100 and the element isolation film 105. Here, the gate electrode 312 may correspond to the word line WL. Unlike the shown example, in an embodiment of the present invention, the gate structure 310 may not include a gate capping conductive film 314.

The gate insulating film 311 may extend along side walls and a bottom surface of the gate trench 315. The gate insulating film 311 may extend along a profile of at least a part of the gate trench 315. The gate insulating film 311 may include, for example, at least one of silicon oxide ($SiO_2$), silicon nitride ($Si_3N_4$), silicon oxynitride (SiON) or a high dielectric constant material having a dielectric constant higher than that of silicon oxide ($SiO_2$). The high dielectric constant material may include, for example, at least one of hafnium oxide ($HfO_2$), hafnium silicon oxide ($HfSiO_4$), hafnium zirconium oxide ($HfZrO_4$), hafnium tantalum oxide ($Hf_2Ta_2O_9$), hafnium aluminum oxide ($HfAlO_3$), lanthanum oxide ($La_2O_3$), lanthanum aluminum oxide ($LaAlO_3$), zirconium oxide ($ZrO_2$), zirconium silicon oxide ($ZrSiO_4$), tantalum oxide ($Ta_2O_5$), titanium oxide ($TiO_2$), barium strontium titanium oxide ($BaSrTi_2O_6$), barium titanium oxide ($BaTiO_3$), strontium titanium oxide ($SrTiO_3$), yttrium oxide ($Y_2O_3$), lithium oxide ($Li_2O$), aluminum oxide ($Al_2O_3$), lead scandium tantalum oxide ($Pb(Sc,Ta)O_3$), lead zinc niobate [$Pb(Zn_{1/3}Nb_{2/3})O_3$], or combinations thereof.

The gate electrode 312 may be formed on the gate insulating film 311. The gate electrode 312 may fill a part of the gate trench 315. The gate capping conductive film 314 may extend along the upper surface of the gate electrode 312.

The gate electrode 312 may include at least one of a metal, a metal alloy, a conductive metal nitride, a conductive metal carbonitride, a conductive metal carbide, a metal silicide, a doped semiconductor material, a conductive metal oxynitride, or a conductive metal oxide. The gate electrode 312 may include, for example, but not limited to, at least one of titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlCN), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (NiPt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), ruthenium titanium nitride (RuTiN), titanium silicide ($TiSi_2$), tantalum silicide ($TaSi_2$), nickel silicide ($NiSi_2$), cobalt silicide ($CoSi_2$), iridium oxide ($IrO_x$), ruthenium oxide ($RuO_x$) or combinations thereof. The gate capping conductive film 314 may include, for example, but not limited to, polysilicon (p-Si) or polysilicon germanium (p-SiGe).

The gate capping pattern 313 may be placed on the gate electrode 312 and the gate capping conductive film 314. The gate capping pattern 313 may fill the gate trench 315 that remains after the gate electrode 312 and the gate capping conductive film 314 are formed. Although the gate insulating film 311 is shown to extend along the side walls of the gate capping pattern 313, the present invention is not limited thereto. For example, in an embodiment of the present invention, the gate insulating film 311 may extend along the side walls of the gate electrode 312, but may not extend along the side walls of the gate capping pattern 313. For example, the top surface of the gate insulating film 311 may be covered by the gate capping pattern 313.

The gate capping pattern 313 may include, for example, at least one of silicon nitride ($Si_3N_4$), silicon oxynitride (SiON), silicon oxide ($SiO_2$), silicon carbonitride (SiCN), silicon oxycarbonitride (SiOCN), or combinations thereof.

An impurity doping region may be formed on at least one side of the gate structure 310. The impurity doping region may be a source/drain region of a transistor.

A bit line structure 340ST may include a cell conductive line 340 and a cell line capping film 344. The cell conductive line 340 may be formed on the substrate 100 and the element isolation film 105 on which the gate structure 310 is formed. The cell conductive line 340 may intersect the element isolation film 105 and the active region ACT. The cell conductive line 340 may be formed to intersect the gate structure 310. Here, the cell conductive line 340 may correspond to a bit line BL.

The cell conductive line 340 may be multiple films. The cell conductive line 340 may include, for example, a first cell conductive film 341, a second cell conductive film 342, and a third cell conductive film 343. The first to third cell conductive films 341, 342, and 343 may be sequentially stacked on the substrate 100 and the element isolation film 105. Although the cell conductive line 340 is shown as a triple film, the present invention is not limited thereto.

Each of the first to third cell conductive films 341, 342, and 343 may include, for example, at least one of an impurity-doped semiconductor material, a conductive silicide compound, a conductive metal nitride, a metal, or a metal alloy. For example, the first cell conductive film 341 includes a doped semiconductor material, the second cell conductive film 342 includes at least one of a conductive silicide compound or a conductive metal nitride, and the third cell conductive film 343 may include at least one of metal or metal alloy. For example, in an embodiment of the present invention, the first cell conductive film 341 may include doped polysilicon (p-Si), the second cell conductive film 342 may include titanium silicon nitride (TiSiN), and the third cell conductive film 343 may include tungsten (W). However, the present invention is not limited thereto.

A direct contact 346 may be formed between the cell conductive line 340 and the substrate 100. That is, the cell conductive line 340 may be formed on the direct contact 346. For example, the direct contact 346 may be formed at a point on which the cell conductive line 340 intersects a central portion of the active region ACT having a long island shape.

The direct contact 346 may electrically connect the cell conductive line 340 and the substrate 100. The direct contact 346 may correspond to a direct contact DC. The direct contact 346 may include, for example, at least one of an impurity-doped semiconductor material, a conductive silicide compound, a conductive metal nitride, or a metal.

The direct contact 346 may penetrate the cell insulating film 330 and connect the active region ACT of the substrate 100 and the bit line structure 340ST. The direct contact 346 may extend into the substrate 100. For example, the substrate 100 may include the trench T formed inside the active region ACT and the element isolation film 105. The trench T may penetrate the cell insulating film 330 to expose at least a part of the active region ACT. The direct contact 346 may be formed inside the trench T to connect the active region ACT and the cell conductive line 340. A lower part of the direct contact 346 may be formed inside the substrate 100. The upper side of the direct contact 346 may be placed inside the bit line structure 340ST. For example, the upper side of the direct contact 346 may come into contact with the second cell conductive film 342.

In an embodiment of the present invention, the trench T may expose the substrate 100, as shown in FIG. 2. Thus, the direct contact 346 may overlap the active region (ACT of FIG. 1) of the substrate 100. In an embodiment of the present invention, a part of the trench T may overlap a part of the element isolation film 105. Accordingly, the trench T may expose not only a part of the substrate 100 but also a part of the element isolation film 105.

The direct contact 346 may comprise a conductive material. Accordingly, the cell conductive line 340 of the bit line structure 340ST may be electrically connected to the active region ACT of the substrate 100. The active region ACT of the substrate 100 connected with the cell conductive line 340 and the direct contact 346 may function as source and drain regions.

In an embodiment of the present invention, the direct contact 346 may include a material the same as that of the first cell conductive film 341. For example, the direct contact 346 may include polysilicon (p-Si). However, the present invention is not limited thereto, and the direct contact 346 may include a material different from that of the first cell conductive film 341 depending on the fabricating process.

In an embodiment of the present invention, the width of the direct contact 346 may be smaller than the width of the trench T. For example, the direct contact 346 may overlap only a part of the substrate 100 exposed by the trench T, as shown in FIG. 2. The direct contact 346 may be placed at the central part of the substrate 100 exposed by the trench T.

In an embodiment of the present invention, the width of the bit line structure 340ST may also be smaller than the width of the trench T. For example, the width of the bit line structure 340ST may be substantially the same as the width of the direct contact 346.

In FIG. 2, the cell conductive line 340 may include a second cell conductive film 342 and a third cell conductive film 343 in a region that overlaps the upper surface of the direct contact 346. The cell conductive line 340 may include first to third cell conductive films 341, 342 and 343 in the region that does not overlap the upper surface of the direct contact 346. For example, the upper side of the first cell conductive film 341 and the upper side of the direct contact 346 may be placed on the same plane.

The cell line capping film 344 may be placed on the cell conductive line 340. The cell line capping film 344 may extend along the upper surface of the cell conductive line 340 in the third direction DR3. At this time, the cell line capping film 344 may include, for example, at least one of a silicon nitride ($Si_3N_4$) film, a silicon oxynitride (SiON) film, a silicon carbonitride (SiCN) film, or a silicon oxycarbonitride (SiOCN) film. In the semiconductor memory device according to an embodiment of the present invention, the cell line capping film 344 may include, for example, a silicon nitride ($Si_3N_4$) film. Although the cell line capping film 344 is shown as a single film, the present invention is not limited thereto. The cell line capping film 344 may be multiple films. However, when each film that constitutes the multiple films is the same material, the cell line capping film 344 may be seen as a single film.

The cell insulating film 330 may be formed on the substrate 100 and the element isolation film 105. For example, the cell insulating film 330 may be formed on the substrate 100 and the element isolation film 105 in which the direct contact 346 is not formed. The cell insulating film 330 may be formed between the substrate 100 and the cell conductive line 340, and between the element isolation film 105 and the cell conductive line 340.

Although the cell insulating film 330 may be a single film, as shown, the cell insulating film 330 may be multiple films including the first cell insulating film 331 and the second cell insulating film 332. For example, although the first cell insulating film 331 may include a silicon oxide ($SiO_2$) film, and the second cell insulating film 332 may include a silicon nitride ($Si_3N_4$) film, the present invention is not limited thereto.

A spacer structure 350 may be placed on side walls of the cell conductive line 340 and the cell line capping film 344. The spacer structure 350 may be formed on the substrate 100 and the element isolation film 105 at a portion of the cell conductive line 340 in which the direct contact 346 is formed. The spacer structure 350 may be placed on side walls of the cell conductive lines 340, the cell line capping films 344 and the direct contacts 346.

The spacer structure 350 may be placed on the cell insulating film 330 in the remaining portions of the cell conductive line 340 in which the direct contact 346 is not formed. The spacer structure 350 may be placed on the side walls of the cell conductive line 340 and the cell line capping film 344.

The spacer structure 350 may be multiple films. For example, the spacer structure 350 may include an inner spacer 351, a lower spacer 350a, and an outer spacer 350b.

The spacer structure 350 may be placed on the side surfaces of the bit line structure 340ST, and may extend along the side surfaces of the bit line structure 340ST. The buried contact 320 may be spaced apart from the bit line structure 340ST by the spacer structure 350.

In an embodiment of the present invention, a part of the spacer structure 350 may come into contact with the substrate 100 and the element isolation film 105. For example, in a region in which the trench T is formed, the lower portion of the spacer structure 350 may fill the trench T. However, the spacer structure 350 may be formed on the cell insulating film 330 in the region in which the trench T is not formed.

The inner spacer 351 may extend along the side surfaces of the direct contact 346 and the trench T. The inner spacer 351 may be placed inside the trench T. The inner spacer 351 may extend along the side surfaces of the direct contact 346 and the bit line structure 340ST.

The inner spacer 351 may include, for example, silicon nitride ($Si_3N_4$). The inner spacer 351 may include a first vertical portion 351a and a first bent portion 351b.

The first vertical portion 351a of the inner spacer 351 may extend along the side surface of the direct contact 346. The first bent portion 351b of the inner spacer 351 may be bent from the first vertical portion 351a. The first bent portion 351b of the inner spacer 351 may extend along the bottom surface of the trench T, and may extend along the profile of the trench T.

The lower spacer 350a may include an oxide film 352, a seed layer 353 and a bulk layer 354. The lower spacer 350a may be placed between the inner spacer 351 and the outer spacer 350b. The lower spacer 350a may be placed on the inner spacer 351, and may be placed below the outer spacer 350b.

Both the seed layer 353 and the bulk layer 354 may include a nitride film. The seed layer 353 may include carbon (C). The seed layer 353 may be placed on the oxide film 352. The bulk layer 354 may not include carbon (C). The bulk layer 354 may be placed on the seed layer 353. Therefore, as it comes closer to the oxide film 352, the concentration of carbon (C) contained in the seed layer 353 may increase.

The oxide film 352 may be placed on the inner spacer 351. The oxide film 352 may be placed in the trench T. The oxide film 352 may be placed between the direct contact 346 and the buried contact 320. The oxide film 352 may be placed on the side part of the direct contact 346. The oxide film 352 may not be placed on the side part of the bit line structure 340ST placed above the direct contact 346. That is, the oxide film 352 may not extend above the direct contact 346.

The oxide film 352 may include, for example, silicon oxide ($SiO_2$). The oxide film 352 may include a second vertical portion 352a and a second bent portion 352b.

The second vertical portion 352a of the oxide film 352 may be placed on the first vertical portion 351a of the inner spacer 351. The first vertical portion 351a of the inner spacer 351 may extend along the profile of the side surface of the direct contact 346. The second vertical portion 352a of the oxide film 352 may extend along the first vertical portion 351a of the inner spacer 351. The second vertical portion 352a of the oxide film 352 may extend along the profile of the side surface of the direct contact 346.

The first bent portion 351b of the inner spacer 351 may extend along the bottom surface of the trench T, and may extend along the profile of the trench T. The second bent portion 352b of the oxide film 352 may be bent from the second vertical portion 352a. The second bent portion 352b of the oxide film 352 may extend along the profile of the trench T. The second bent portion 352b of the oxide film 352 may be placed on the first bent portion 351b of the inner spacer 351. The second bent portion 352b of the oxide film 352 may extend along the first bent portion 351b of the inner spacer 351.

An uppermost end of the oxide film 352 may be placed below the uppermost surface 346US of the direct contact 346. Accordingly, the oxide film 352 may be placed between the direct contact 346 and the buried contact 320. On the other hand, the oxide film 352 may not be placed between the bit line structure 340ST placed on the direct contact 346 and the buried contact 320.

A lowermost end of the oxide film 352 may be placed below an upper surface 100_US of the substrate 100. The lowermost end of the oxide film 352 may be placed inside the trench T.

The oxide film 352 may come into contact with the buried contact 320. For Example, the second bent portion 352b of the oxide film 352 may come into contact with the buried contact 320. The second vertical portion 352a of the oxide film 352 may not come into contact with the buried contact 320.

The seed layer 353 may be placed on the oxide film 352. The seed layer 353 may be placed inside the trench T. The seed layer 353 may be placed between the direct contact 346 and the buried contact 320. The seed layer 353 may be placed on the side part of the direct contact 346. The seed layer 353 may not be placed on the side part of the bit line structure 340ST placed above the direct contact 346. That is, the seed layer 353 may not extend above the direct contact 346.

The seed layer 353 may include silicon carbonitride (SiCN). The seed layer 353 may include a third vertical portion 353a and a third bent portion 353b.

The third vertical portion 353a of the seed layer 353 may be placed on the second vertical portion 352a of the oxide film 352. The third vertical portion 353a of the seed layer 353 may extend along the second vertical portion 352a of the oxide film 352. Since the second vertical portion 352a of the oxide film 352 may extend along the profile of the side surface of the direct contact 346, the third vertical portion 353a of the seed layer 353 may also extend along the profile of the side surface of the direct contact 346.

The third bent portion 353b of the seed layer 353 may be bent from the third vertical portion 353a. Similar to the first bent portion 351b of the inner spacer 351 and the second bent portion 352b of the oxide film 352, the third bent portion 353b of the seed layer 353 may extend along the profile of the trench T. The third bent portion 353b of the seed layer 353 may be placed on the second bent portion 352b of the oxide film 352. The third bent portion 353b of the seed layer 353 may extend along the second bent portion 352b of the oxide film 352.

An uppermost end of the seed layer 353 may be placed below the uppermost surface 346US of the direct contact 346. Thus, the seed layer 353 may be placed between the direct contact 346 and the buried contact 320. On the other hand, the seed layer 353 may not be placed between the bit line structure 340ST placed on the direct contact 346 and the buried contact 320. For example, the seed layer 353 may not extend between the bit line structure 340ST placed on the direct contact 346 and the buried contact 320.

A lowermost end of the seed layer 353 may be placed below the upper surface 100_US of the substrate 100. The lowermost end of the seed layer 353 may be placed inside the trench T.

The seed layer 353 may come into contact with the buried contact 320. For example, the third bent portion 353b of the seed layer 353 may come into contact with the buried contact 320. The third vertical portion 353a of the seed layer 353 may not come into contact with the buried contact 320.

The bulk layer 354 may be placed on the seed layer 353. The bulk layer 354 may be placed inside the trench T. Thus, the seed layer 353 may come into contact with the oxide film 352 and the bulk layer 354 inside the trench T. The bulk layer 354 may be placed between the direct contact 346 and the buried contact 320. The bulk layer 354 may be placed on the side part of the direct contact 346. The bulk layer 354 may not be placed on the side part of the bit line structure 340ST placed above the direct contact 346. That is, the bulk layer 354 may not extend above the direct contact 346.

The bulk layer 354 may include silicon nitride ($Si_3N_4$). The bulk layer 354 may fill the trench T. The bulk layer 354 may be thicker than the seed layer 353.

The uppermost end of the bulk layer 354 may be placed below the uppermost surface 346US of the direct contact 346. Thus, the bulk layer 354 may be placed between the direct contact 346 and the buried contact 320. On the other hand, the bulk layer 354 may not be placed between the bit line structure 340ST placed on the direct contact 346 and the buried contact 320. The bulk layer 354 may come into contact with the buried contact 320. Accordingly, the lower spacer 350a including the oxide film 352, the seed layer 353 and the bulk layer 354 may not be placed on the side part of the bit line structure 340ST placed above the direct contact 346. For example, the lower spacer 350a may not extend above the direct contact 346. For example, the lower spacer 350a may be placed between the buried contact 320 and the direct contact 346, and not placed between the bit line structure 340ST and the buried contact 320 above the direct contact 346.

A lowermost end of the bulk layer 354 may be placed below the upper surface 100_US of the substrate 100. The lowermost end of the bulk layer 354 may be placed inside the trench T.

Referring to FIG. 3, the bulk layer 354 may fill the trench T on the seed layer 353. Referring to FIG. 4, the bulk layer 354 may include a void V.

The outer spacer 350b may be placed on the lower spacer 350a. The outer spacer 350b may be placed on the side surface of the inner spacer 351. For example, the outer spacer 350b may be placed on the oxide film 352, the seed layer 353 and the bulk layer 354, and placed on the side surface of the inner spacer 351. The outer spacer 350b may be placed on the side parts of the direct contact 346 and the bit line structure 340ST. The outer spacer 350b may include a first sub-spacer 355 and a second sub-spacer 356.

The first sub-spacer 355 may be placed on the inner spacer 351. The first sub-spacer 355 may extend along the side surfaces of the inner spacer 351. The first sub-spacer 355 may include, for example, silicon oxide ($SiO_2$).

The second sub-spacer 356 may be placed on the first sub-spacer 355. The second sub-spacer 356 may extend along the side surface of the first sub-spacer 355. The second sub-spacer 356 may include, for example, silicon nitride ($Si_3N_4$).

Although the outer spacer 350b is shown as double films including the first sub-spacer 355 and the second sub-spacer 356 in FIGS. 2 to 4, the present invention is not limited thereto. For example, the outer spacer 350b may be a single film. In an embodiment of the present invention, the outer spacer 350b may be multiple films including three spacers.

The seed layer 353 may be placed between the oxide film 352 and the bulk layer 354. The seed layer 353 may prevent diffusion of oxygen (O) from the oxide film 352 into the bulk layer 354. Since, the bulk layer 354 may include silicon nitride ($Si_3N_4$), and the oxide film 352 may include, for example, silicon oxide ($SiO_2$), the seed layer 353 may function as a blocking layer that can suppress the interface intermixing reaction between silicon oxide ($SiO_2$) and silicon nitride ($Si_3N_4$). For example, the seed layer 353 may function as an oxygen (O) diffusion barrier. When oxygen (O) is diffused into the bulk layer 354, the bulk layer 354 may be easily etched. In this case, since the bulk layer 354 is etched during the process of forming the buried contact 320 after forming the direct contact 346 and the spacer structure 350, a spaced distance between the buried contact 320 and the direct contact 346 may decrease. For example, if the separation distance between the buried contact 320 and the direct contact 346 is shortened, electrical connection may occur when a voltage is applied even no direct physical contact between the buried contact 320 and the direct contact 346, which can lead to a deterioration in reliability of the semiconductor memory device.

The seed layer 353 including silicon carbonitride (SiCN) may react with oxygen (O) that is diffused from the oxide film 352. For example, oxygen (O) diffused from the oxide film 352 may undergo a bonding reaction with silicon carbonitride (SiCN) of the seed layer 353. Because the bonding between silicon carbonitride (SiCN) and oxygen (O) is relatively stable, so diffusion can be suppressed. The seed layer 353 may prevent oxygen (O) of the oxide film 352 from diffusing into the bulk layer 354. Therefore, when forming the buried contact 320 after forming the direct contact 346 and the spacer structure 350, the spacer structure 350 including the bulk layer 354 may stably separate the buried contact 320 and the direct contact 346.

A fence pattern 370 may be placed on the substrate 100 and the element isolation film 105. The fence pattern 370 may be formed to overlap the gate structure 310 formed inside the substrate 100 and the element isolation film 105. The fence pattern 370 may be placed between the bit line structures 340ST extending in the third direction DR3. The fence pattern 370 may include, for example, at least one of silicon oxide (SiO$_2$), silicon nitride (Si$_3$N$_4$), silicon oxynitride (SiON), or combinations thereof.

The buried contact 320 may be placed between the bit lines BL adjacent to each other in the first direction DR1. For example, the buried contact 320 may be placed between the cell conductive lines 340 adjacent to each other in the first direction DR1. The buried contact 320 may be placed between the fence patterns 370 adjacent to each other in the third direction DR3. The buried contact 320 may overlap the substrate 100 and the element isolation films 105 between the adjacent cell conductive lines 340. The buried contact 320 may be connected to the active region ACT. Here, the buried contact 320 may correspond to the buried contact BC.

The buried contact 320 may penetrate the cell insulating film 330 and connect the active region ACT of the substrate 100 and the landing pad 360. For example, the substrate 100 may include a contact recess 320R in the active region ACT. The contact recess 320R may expose a part of the substrate 100 and a part of the element isolation film 105. The buried contact 320 may fill the contact recess 320R. The buried contact 320 is formed in the contact recess 320R and may connect the active region ACT of the substrate 100 and the landing pad 360.

The buried contact 320 may come into contact with the inner spacer 351, the oxide film 352, the seed layer 353 and the bulk layer 354. The buried contact 320 may come into contact with the first bent portion 351b of the inner spacer 351, the second bent portion 352b of the oxide film 352 and the third bent portion 353b of the seed layer 353.

The buried contact 320 may not come into contact with the first vertical portion 351a of the inner spacer 351, the second vertical portion 352a of the oxide film 352 and the third vertical portion 353a of the seed layer 353.

The buried contact 320 may include, for example, at least one of a semiconductor material doped with impurities, a conductive silicide compound, a conductive metal nitride, or a metal.

The landing pad 360 may be formed on the buried contact 320, and may be electrically connected to the buried contact 320. The landing pad 360 may be connected to the active region ACT of the substrate 100 through the buried contact 320. The landing pad 360 may correspond to the landing pad LP.

The landing pad 360 may overlap a part of the upper surface of the bit line structure 340ST. The landing pad 360 may include, for example, at least one of a semiconductor material doped with impurities, a conductive silicide compound, a conductive metal nitride, a conductive metal carbide, a metal or a metal alloy.

A pad isolation insulating film 380 may be formed on the landing pad 360 and the bit line structure 340ST. For example, the pad isolation insulating film 380 may be placed on the cell line capping film 344. The pad isolation insulating film 380 may define a landing pad 360 that forms a plurality of isolation regions. The pad isolation insulating film 380 may not cover the upper surface of the landing pad 360. For example, a height of the upper surface of the landing pad 360 may be equal to a height of the upper surface of the pad isolation insulating film 380 on the basis of the upper surface of the substrate 100.

The pad isolation insulating film 380 may include an insulating material, and electrically isolate the plurality of landing pads 360 from each other. For example, the pad isolation insulating film 380 may include at least one of a silicon oxide (SiO$_2$) film, a silicon nitride (Si$_3$N$_4$) film, a silicon oxynitride (SiON) film, a silicon oxycarbonitride (SiOCN) film, or a silicon carbonitride (SiCN) film.

An etching stop film 130 may be placed on the upper surface of the pad isolation insulating film 380, and may also be placed on the upper surface of the landing pad 360. The etching stop film 130 may include, for example, at least one of silicon nitride (Si$_3$N$_4$), silicon carbonitride (SiCN), silicon oxycarbonitride (SiOCN), silicon oxycarbide (SiOC), or silicon boronitride (SiBN).

The capacitor CAP may be placed on the landing pad 360. The capacitor CAP may be connected to the landing pad 360. That is, the capacitor CAP may be electrically connected to the buried contact 320. For example, the capacitor CAP may be placed on the buried contact 320 with the landing pad 360 disposed therebetween, and may be electrically connected to the buried contact 320 through the landing pad 360.

The capacitor CAP may include a lower electrode 210, a capacitor dielectric film 220, and an upper electrode 230. The capacitor CAP may store charges in the capacitor dielectric film 220, using a potential difference generated between the lower electrode 210 and the upper electrode 230.

The lower electrode 210 may be placed on the landing pad 360. Although the lower electrode 210 is shown to have a pillar shape, the present invention is not limited thereto. The lower electrode 210 may, of course, have a cylindrical shape.

The capacitor dielectric film 220 may be placed between the lower electrode 210 and the upper electrode 230. The capacitor dielectric film 220 is formed on the lower electrode 210. The capacitor dielectric film 220 may be placed below the upper electrode 230. The capacitor dielectric film 220 may be formed along the profile of the lower electrode 210. For example, the capacitor dielectric film 220 may be formed along the upper side and a part of the side surfaces of the lower electrode 210, and may be formed along the upper side of the etching stop film 130. The upper electrode 230 is formed on the capacitor dielectric film 220. The upper electrode 230 may cover the outer side wall of the lower electrode 210.

The lower electrode 210 and the upper electrode 230 may include, for example, but not limited to, a doped semiconductor material, a conductive metal nitride (e.g., titanium nitride (TiN), tantalum nitride (TaN), niobium nitride (NbN), tungsten nitride (WN), etc.), a metal (e.g., ruthenium (Ru), iridium (Jr), titanium (Ti), tantalum (Ta), etc.), and a conductive metal oxide (e.g., iridium oxide ($IrO_x$), niobium oxide ($NbO_x$), etc.).

The capacitive dielectric film 220 may include, for example, but not limited to, at least one of silicon oxide ($SiO_2$), silicon nitride ($Si_3N_4$), silicon oxynitride (SiON), high dielectric constant materials, or combinations thereof. In the semiconductor memory device according to an embodiment of the present invention, the capacitor dielectric film 220 may include a stacked film structure in which zirconium oxide ($ZrO_2$), aluminum oxide ($Al_2O_3$), and zirconium oxide ($ZrO_2$) are sequentially stacked. In the semiconductor memory device according to an embodiment of the present invention, the capacitor dielectric film 220 may include a dielectric film including hafnium (Hf). In the semiconductor memory device according to an embodiment of the present invention, the capacitor dielectric film 220 may have a stacked film structure of a ferroelectric material film and a paraelectric material film.

Figure 6:
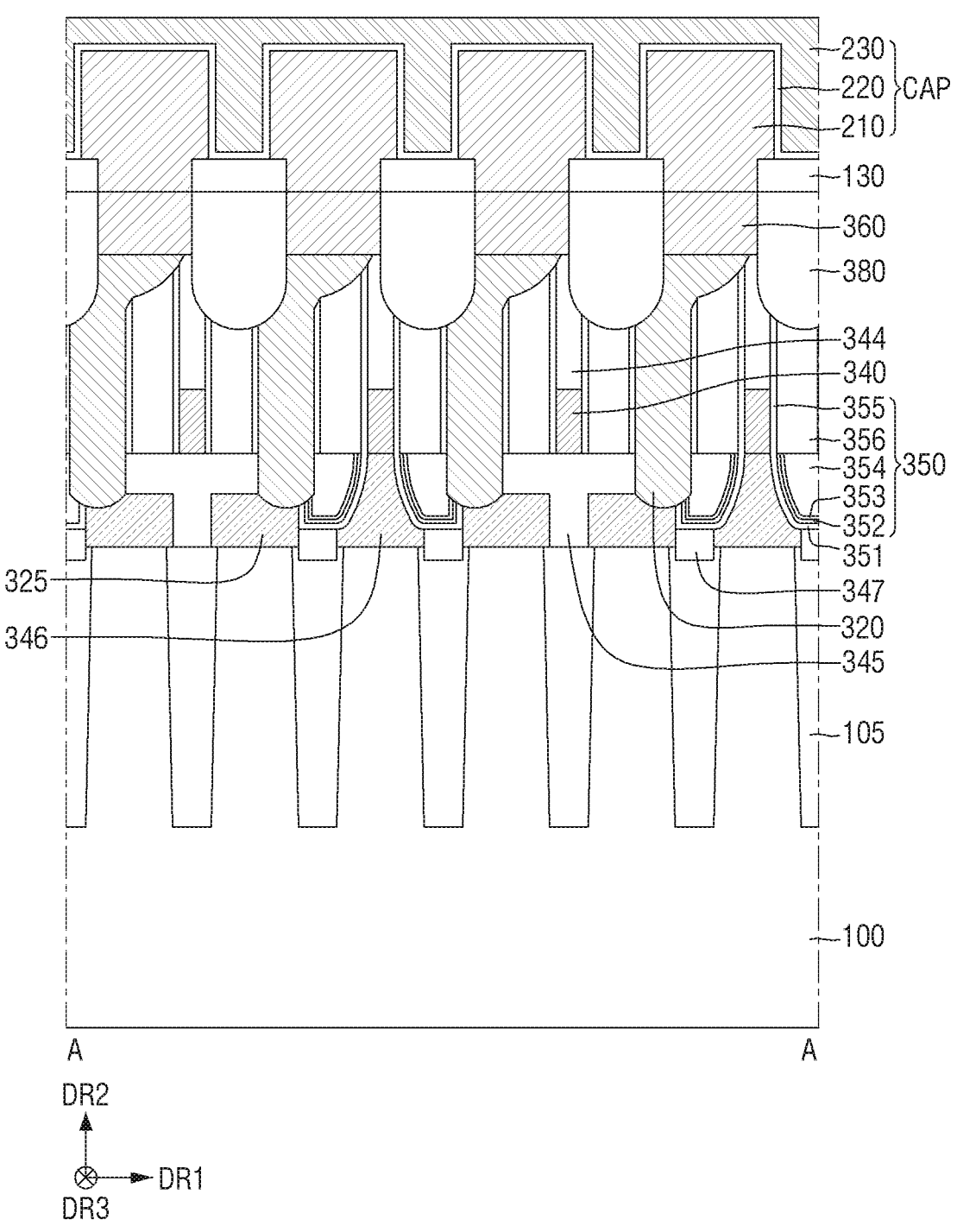
FIG. 6 is a diagram for explaining a semiconductor memory device according to an embodiment of the present invention.

FIG. 6 is a diagram for explaining a semiconductor memory device according to an embodiment of the present invention. For reference, FIG. 6 shows a cross-sectional view taken along A-A of FIG. 1. For convenience of description, the explanation will be mainly provided on points that are different from those described with reference to FIGS. 1 to 5.

Referring to FIG. 6, the semiconductor memory device according to an embodiment of the present invention may further include a node pad 325.

The direct contact 346 includes an upper surface connected to the cell conductive line 340, and a lower surface connected to the active region ACT of the substrate 100. A width of the upper surface of the direct contact 346 in the first direction DR1 may be smaller than the width of the lower surface of the direct contact 346 in the first direction DR1. The width of the direct contact 346 may gradually increase, as it goes away from cell conductive line 340. That is, the direct contact 346 may have a width that is gradually wide from top toward bottom.

The node pad 325 may be located on the substrate 100. The node pad 325 may be placed on the active region ACT of the substrate 100. The node pad 325 may be located between the buried contact 320 and the substrate 100.

The upper surface of the node pad 325 may be lower than the upper surface of the direct contact 346 on the basis of the upper surface of the element isolation film 105. The upper surface of the node pad 325 may be lower than the lower surface of the cell conductive line 340, on the basis of the upper surface of the element isolation film 105.

A contact isolation pattern 347 may be interposed between the direct contact 346 and the node pad 325 adjacent thereto to separate the direct contact 346 and the node pad 325 in the first direction DR1. The contact isolation pattern 347 may include an insulating material.

The node isolation pattern 345 may be interposed between the adjacent node pads 325. The node isolation pattern 345 is placed on the substrate 100. The node isolation pattern 345 may separate the adjacent node pads 325 in the first direction DR1. The node isolation pattern 345 may cover the upper surfaces of the node pads 325 adjacent in the first direction DR1. In a cross-sectional view, the node isolation pattern 345 may have a "T" shape.

An upper surface of the node isolation pattern 345 may be placed in a plane the same as that of an upper surface of the direct contact 346. The upper surface of the node isolation pattern 345 may be located at a height the same as that of the upper surface of the direct contact 346, on the basis of the upper surface of the element isolation film 105. The upper surface of the node isolation pattern 345 may be located at a height the same as that of the lower surface of the cell conductive line 340, on the basis of the upper surface of the element isolation film 105.

The node isolation pattern 345 may include, for example, an insulating material. The lower surface of the node isolation pattern 345 may be located at a height the same as that of the upper surface of the element isolation film 105, but the present invention is not limited thereto. For example, in an embodiment of the present invention, the lower surface of the node isolation pattern 345 may be lower than the upper surface of the element isolation film 105.

The stacked structure of the cell conductive line 340 in the region that overlaps the upper surface of the direct contact 346 may be the same as the stacked structure of the cell conductive line 340 in the region that does not overlap the upper surface of the direct contact 346.

The buried contact 320 is connected to the node pad 325. The buried contact 320 connects the node pad 325 and the landing pad 360.

A spacer structure 350 may be placed between the buried contact 320 and the direct contact 346. The spacer structure 350 may include an inner spacer 351, an oxide film 352, a seed layer 353, a bulk layer 354, and outer spacers 355 and 356. The buried contact 320 may come into contact with the oxide film 352, the seed layer 353 and the bulk layer 354.

The uppermost ends of the seed layer 353 and the bulk layer 354 may be placed below the uppermost surface of the buried contact 320. Similar to FIG. 2, the seed layer 353 in FIG. 6 here may be placed between the oxide film 352 and the bulk layer 354. The seed layer 353 may include silicon carbonitride (SiCN), and may prevent diffusion of oxygen (O) from the oxide film 352 into the bulk layer 354. The bulk layer 354 with reduced oxygen (O) diffusion may not be excessively etched during the formation of the buried contact 320 after forming the direct contact 346 and the spacer structure 350, and thus, the spacer structure 350 including the bulk layer 354 may stably separate the buried contact 320 and the direct contact 346.

Figure 7:
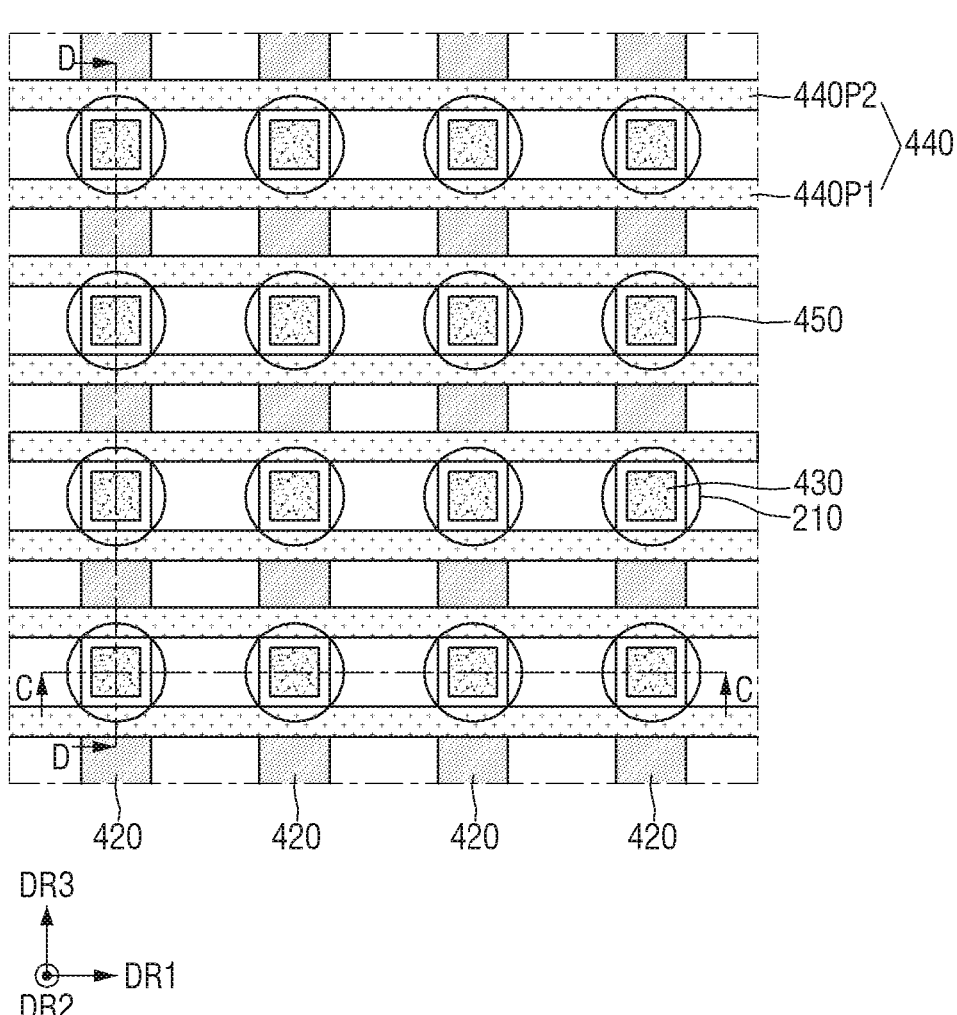
FIG. 7 is a layout diagram for explaining a semiconductor memory device according to an embodiment of the present invention.
Figure 8:
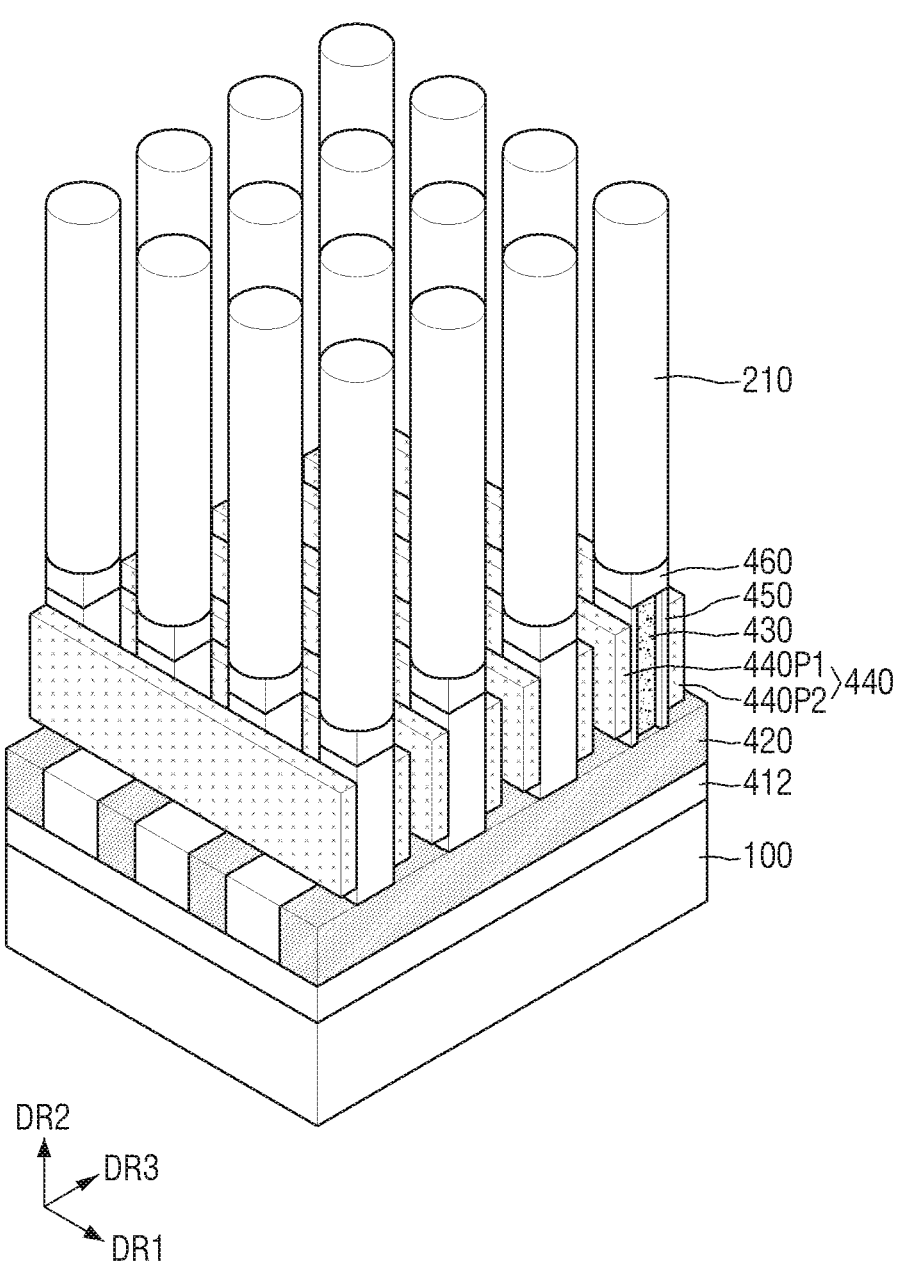
FIG. 8 is a perspective view for explaining a semiconductor memory device according to an embodiment of the present invention.
Figure 9:
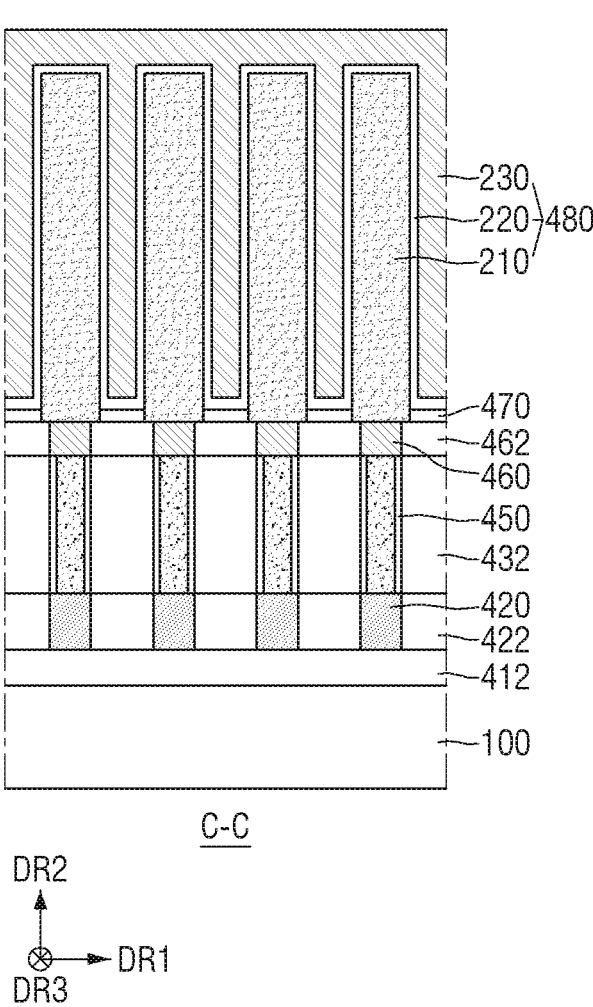
FIG. 9 is a cross-sectional view taken along line C-C of FIG. 7.
Figure 10:
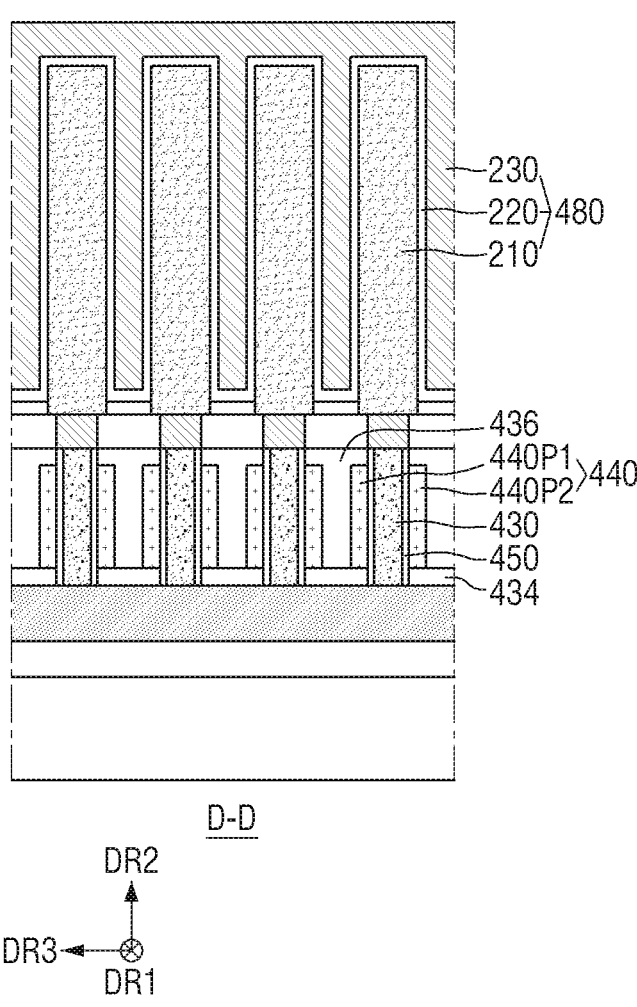
FIG. 10 is a cross-sectional view taken along line D-D of FIG. 7.

FIG. 7 is a layout diagram for explaining a semiconductor memory device according to an embodiment of the present invention. FIG. 8 is a perspective view for explaining a semiconductor memory device according to an embodiment of the present invention. FIG. 9 is a cross-sectional view taken along line C-C of FIG. 7. FIG. 10 is a cross-sectional view taken along line D-D of FIG. 7. For convenience of explanation, the explanation will be mainly provided on points that are different from those explained with reference to FIGS. 1 to 6.

Referring to FIGS. 7 to 10, the semiconductor memory device may include a substrate 100, a plurality of first conductive lines 420, a channel layer 430, a gate electrode 440, a gate insulating layer 450, and a capacitor structure 480. The semiconductor memory device of FIGS. 7 to 10 may be a memory device including the vertical channel transistor (VCT). The vertical channel transistor may refer to a structure in which a channel length of the channel layer 430 extends from the substrate 100 along the vertical direction.

A lower insulating layer 412 may be placed on the substrate 100, and a plurality of first conductive lines 420 may be spaced apart from each other in the first direction DR1 and extend in the third direction DR3 on the lower insulating layer 412.

A plurality of first insulating patterns 422 may be placed on the lower insulating layer 412 to fill spaces between the plurality of first conductive lines 420. The plurality of first insulating patterns 422 may extend in the third direction DR3, and the upper surfaces of the plurality of first insulating patterns 422 may be placed at a level the same as that of the upper surfaces of the plurality of first conductive lines 420. The plurality of first conductive lines 420 may function as bit lines of the semiconductor memory device.

In an embodiment of the present invention, the plurality of first conductive lines 420 may include doped polysilicon (p-Si), metal, conductive metal nitride, conductive metal silicide, conductive metal oxide or combinations thereof. For example, the plurality of first conductive lines 420 may be made of, but not limited to, doped polysilicon (p-Si), aluminum (Al), copper (Cu), titanium (Ti), tantalum (Ta), ruthenium (Ru), tungsten (W), molybdenum (Mo), platinum (Pt), nickel (Ni), cobalt (Co), titanium nitride (TiN), tantalum nitride (TaN), tungsten nitride (WN), niobium nitride (NbN), titanium aluminum (TiAl), titanium aluminum nitride (TiAlN), titanium silicide (TiSi$_2$), titanium silicon nitride (TiSiN), tantalum silicide (TaSi$_2$), tantalum silicon nitride (TaSiN), ruthenium titanium nitride (RuTiN), nickel silicide (NiSi$_2$), cobalt silicide (CoSi$_2$), iridium oxide (IrO$_x$), ruthenium oxide (RuO$_x$) or a combination thereof. The plurality of first conductive lines 420 may include a single layer or multiple layers of the above-mentioned materials. In an embodiment of the present invention, the plurality of first conductive lines 420 may include a two-dimensional semiconductor material, and the two-dimensional semiconductor material may include, for example, graphene, carbon (C) nanotube or a combination thereof.

The channel layers 430 may be arranged in the form of a matrix in which they are placed apart from each other in the first direction DR1 and the third direction DR3 on the plurality of first conductive lines 420. The channel layer 430 may have a first width along the first direction DR1 and a first height along the second direction DR2, and the first height may be greater than the first width. For example, the first height may be, but not limited to, about 2 to 10 times the first width. A bottom portion of the channel layer 430 may function as a first source/drain region, an upper portion of the channel layer 430 may function as a second source/drain region, and a part of the channel layer 430 between the first and second source/drain regions may function as a channel region.

In an embodiment of the present invention, the channel layer 430 may include an oxide semiconductor, and the oxide semiconductor may include, for example, indium gallium zinc oxide (In$_x$Ga$_y$Zn$_z$O), indium gallium silicon oxide (In$_x$Ga$_y$Si$_z$O), indium tin zinc oxide (In$_x$Sn$_y$Zn$_z$O), indium zinc oxide (In$_x$Zn$_y$O), zinc oxide (Zn$_x$O), zinc tin oxide (Zn$_x$Sn$_y$O), zinc oxynitride (Zn$_x$O$_y$N), zirconium zinc tin oxide (Zr$_x$Zn$_y$Sn$_z$O), tin oxide (Sn$_x$O), hafnium indium zinc oxide (Hf$_x$In$_y$Zn$_z$O), gallium zinc tin oxide (Ga$_x$Zn$_y$Sn$_z$O), aluminum zinc tin oxide (Al$_x$Zn$_y$Sn$_z$O), Ytterbium gallium zinc oxide (Yb$_x$Ga$_y$Zn$_z$O), indium gallium oxide (In$_x$Ga$_y$O) or combinations thereof. The channel layer 430 may include a single layer or multiple layers of the oxide semiconductor. In an embodiment of the present invention, the channel layer 430 may have a bandgap energy that is greater than the bandgap energy of silicon (Si). For example, the channel layer 430 may have a bandgap energy of about 1.5 eV to 5.6 eV. For example, the channel layer 430 may have optimum channel performance when having the bandgap energy of about 2.0 eV to 4.0 eV. For example, the channel layer 430 may be, but not limited to, polycrystalline (p-Si) or amorphous silicon (a-Si). In an embodiment of the present invention, the channel layer 430 may include a two-dimensional semiconductor material, and the two-dimensional semiconductor material may include, for example, graphene, carbon (C) nanotube or a combination thereof.

The gate electrode 440 may extend in the first direction DR1 on both side walls of the channel layer 430. The gate electrode 440 may include a first sub-gate electrode 440P1 that faces a first side wall of the channel layer 430, and a second sub-gate electrode 440P2 that faces a second side wall opposite to the first side wall of the channel layer 430. As the single channel layer 430 is placed between the first sub-gate electrode 440P1 and the second sub-gate electrode 440P2, the semiconductor memory device may have a dual gate transistor structure. However, the present invention is not limited thereto. For example, in an embodiment of the present invention, the second sub-gate electrode 440P2 may be omitted, and only the first sub-gate electrode 440P1 that faces the first side wall of the channel layer 430 may be formed to implement a single gate transistor structure.

The gate electrode 440 may include doped polysilicon (p-Si), metal, conductive metal nitride, conductive metal silicide, conductive metal oxide or a combination thereof. For example, the gate electrode 440 may be made of, but not limited to, doped polysilicon (p-Si), aluminum (Al), copper (Cu), titanium (Ti), tantalum (Ta), ruthenium (Ru), tungsten (W), molybdenum (Mo), platinum (Pt), nickel (Ni), cobalt (Co), titanium nitride (TiN), tantalum nitride (TaN), tungsten nitride (WN), niobium nitride (NbN), titanium aluminum (TiAl), titanium aluminum nitride (TiAlN), titanium silicide (TiSi$_2$), titanium silicon nitride (TiSiN), tantalum silicide (TaSi$_2$), tantalum silicon nitride (TaSiN), ruthenium titanium nitride (RuTiN), nickel silicide (NiSi$_2$), cobalt silicide (CoSi$_2$), iridium oxide (IrO$_x$), ruthenium oxide (RuO$_x$) or a combination thereof.

The gate insulating layer 450 surrounds the side walls of the channel layer 430, and may be interposed between the channel layer 430 and the gate electrode 440. For example, as shown in FIG. 7, the entire side walls of the channel layer 430 may be surrounded by the gate insulating layer 450, and a part of the side walls of the gate electrode 440 may come into contact with the gate insulating layer 450. In an embodiment of the present invention, the gate insulating layer 450 extends in an extension direction (that is, the first direction DR1) of the gate electrode 440, and only two side walls that face the gate electrode 440 among the side walls of the channel layer 430 may come into contact with the gate insulating layer 450.

In an embodiment of the present invention, the gate insulating layer 450 may be made of a silicon oxide (SiO$_2$) film, a silicon oxynitride (SiON) film, a high dielectric film having a dielectric constant higher than that of the silicon oxide (SiO$_2$) film, or a combination thereof. The high dielectric film may be made of a metal oxide or a metal oxide nitride. For example, the high dielectric film that may be used as the gate insulating layer 450 may be made of, but not limited to, hafnium oxide (HfO$_2$), hafnium silicon oxide (HfSiO$_4$), hafnium silicon oxynitride (HfSiON), hafnium tantalum oxide (Hf$_2$Ta$_2$O$_9$), hafnium titanium oxide (HfTiO$_4$), hafnium zirconium oxide (HfZrO$_4$), zirconium oxide (ZrO$_2$), aluminum oxide (Al$_2$O$_3$) or a combination thereof.

A plurality of second insulating patterns 432 may extend along the third direction DR3 on the plurality of first insulating patterns 422, and the channel layer 430 may be placed between the two adjacent second insulating patterns 432 among the plurality of second insulating patterns 432. Further, a first buried layer 434 and a second buried layer 436 may be placed in a space between the two adjacent channel layers 430, between the two adjacent second insulating patterns 432. The first buried layer 434 is placed at the bottom portion of the space between the two adjacent channel layers 430, and the second buried layer 436 may be formed to fill the rest of the space between the two adjacent channel layers 430 on the first buried layer 434. An upper surface of the second buried layer 436 is placed at a level the same as that of the upper surface of the channel layer 430, and the second buried layer 436 may cover the upper surface of the gate electrode 440. In contrast, the plurality of second insulating patterns 432 may be formed of a material layer that is continuous with the plurality of first insulating patterns 422, or the second buried layer 436 may be formed of a material layer that is continuous with the first buried layer 434.

Capacitor contacts 460 may be placed on the channel layer 430. The capacitor contacts 460 are placed to vertically overlap the channel layer 430, and may be arranged in the form of a matrix in which they are spaced apart from each other in the first direction DR1 and the third direction DR3. The capacitor contacts 460 may be made of, but not limited to, doped polysilicon (p-Si), aluminum (Al), copper (Cu), titanium (Ti), tantalum (Ta), ruthenium (Ru), tungsten (W), molybdenum (Mo), platinum (Pt), nickel (Ni), cobalt (Co), titanium nitride (TiN), tantalum nitride (TaN), tungsten nitride (WN), niobium nitride (NbN), titanium aluminum (TiAl), titanium aluminum nitride (TiAlN), titanium silicide (TiSi$_2$), titanium silicon nitride (TiSiN), tantalum silicide (TaSi$_2$), tantalum silicon nitride (TaSiN), ruthenium titanium nitride (RuTiN), nickel silicide (NiSi$_2$), cobalt silicide (CoSi$_2$), iridium oxide (IrO$_x$), ruthenium oxide (RuO$_x$) or a combination thereof. The upper insulating film 462 may surround the side walls of the capacitor contacts 460 on the plurality of second insulating patterns 432 and the second buried layer 436.

An etching stop film 470 is placed on the upper insulating film 462, and a capacitor structure 480 may be placed on the etching stop film 470. The capacitor structure 480 may include a lower electrode 210, a capacitor dielectric film 220, and an upper electrode 230.

The lower electrode 210 penetrates the etching stop film 470 and may be electrically connected to the upper surface of the capacitor contact 460. The lower electrode 210 may be formed, but not limited to, in a pillar type extending in the second direction DR2. In an embodiment of the present invention, the lower electrodes 210 are placed to overlap perpendicularly to the capacitor contacts 460, and may be arranged in the form of a matrix in which they are spaced apart from each other in the first direction DR1 and the third direction DR3. In contrast, in an embodiment of the present invention, a landing pad may be further placed between the capacitor contact 460 and the lower electrode 210, and the lower electrode 210 may be arranged in a hexagonal shape.

Figure 11:
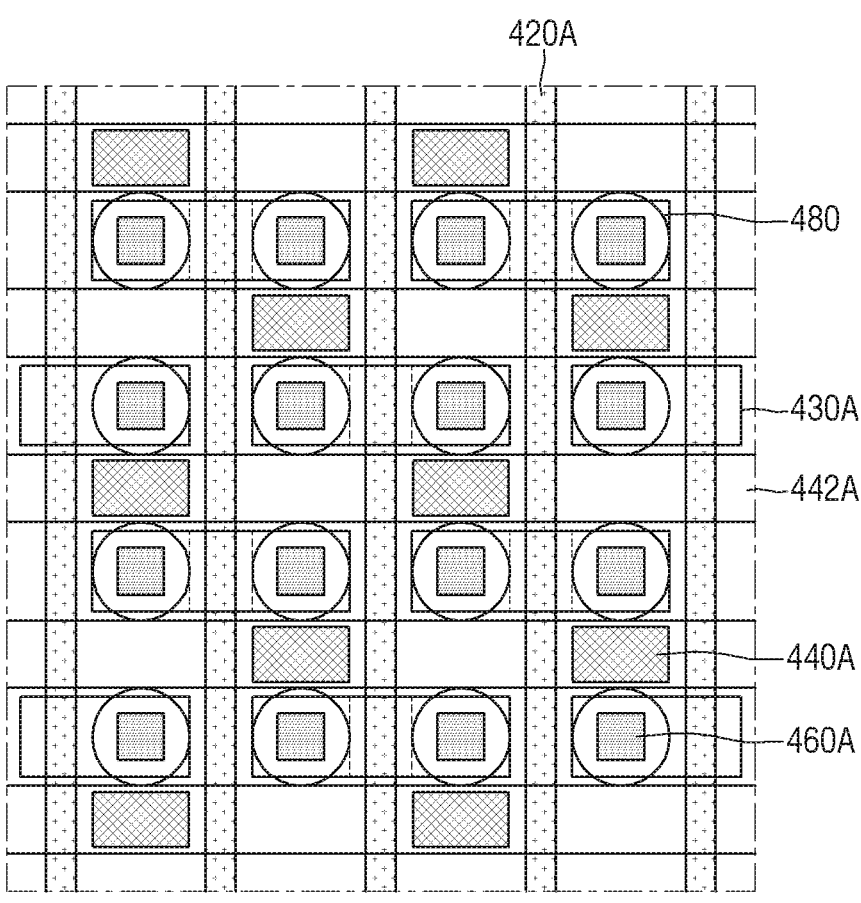
FIG. 11 is a layout diagram for explaining a semiconductor memory device according to an embodiment of the present invention.
Figure 11:
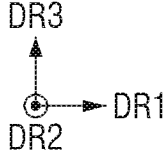
Figure 12:
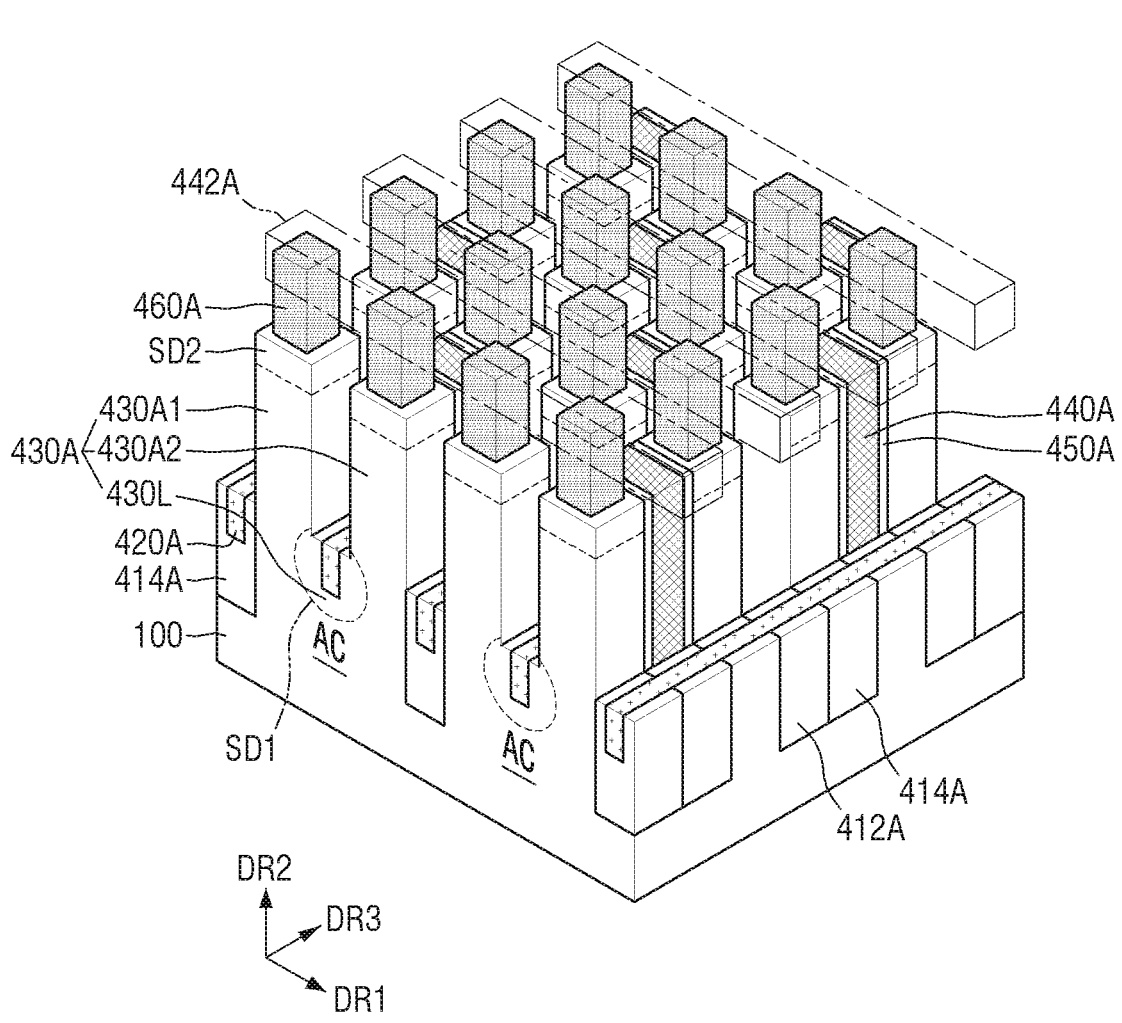
FIG. 12 is a perspective view for explaining the semiconductor memory device according to an embodiment of the present invention.

FIG. 11 is a layout diagram for explaining a semiconductor memory device according to an embodiment of the present invention. FIG. 12 is a perspective view for explaining the semiconductor memory device according to an embodiment of the present invention. For convenience of explanation, the explanation will be mainly provided on points that are different from those described with reference to FIGS. 7 to 10.

Referring to FIGS. 11 and 12, the semiconductor memory device may include a substrate 100, a plurality of first conductive lines 420A, a channel structure 430A, a contact gate electrode 440A, a plurality of second conductive lines 442A, and a capacitor structure 480. The semiconductor memory device may be a memory device that includes a vertical channel transistor (VCT).

A plurality of active regions AC may be defined by the first element isolation film 412A and the second element isolation film 414A on the substrate 100. The channel structure 430A may be placed in each active region AC, and the channel structure 430A may include a first active pillar 430A1 and a second active pillar 430A2 each extending in the vertical direction, and a connecting portion 430L connected to a bottom portion of the first active pillar 430A1 and a bottom portion of the second active pillar 430A2. A first source/drain region SD1 may be placed inside the connecting portion 430L, and a second source/drain region SD2 may be placed above the first and second active pillars 430A1 and 430A2. The first active pillar 430A1 and the second active pillar 430A2 may each form an independent unit memory cell.

The plurality of first conductive lines 420A may extend in a direction intersecting each of the plurality of active regions AC, and may extend, for example, in the third direction DR3. One first conductive line 420A of the plurality of first conductive lines 420A may be placed on the connecting portion 430L between the first active pillar 430A1 and the second active pillar 430A2, and the one first conductive line 420A may be placed on the first source/drain region SD1. The other first conductive line 420A adjacent to the one first conductive line 420A may be placed between the two channel structures 430A. One first conductive line 420A of the plurality of first conductive lines 420A may function as a common bit line included in two unit memory cells formed by the first active pillar 430A1 and the second active pillar 430A2 placed on both sides of the one first conductive line 420A.

One contact gate electrode 440A may be placed between the two channel structures 430A adjacent to each other in the third direction DR3. For example, the contact gate electrode 440A may be placed between the first active pillar 430A1 included in one channel structure 430A and the second active pillar 430A2 of the channel structure 430A adjacent thereto. One contact gate electrode 440 may be shared by the first active pillar 430A1 and the second active pillar 430A2 placed on both side walls thereof. A gate insulating layer 450A may be placed between the contact gate electrode 440A and the first active pillar 430A1, and between the contact gate electrode 440A and the second active pillar 430A2. The plurality of second conductive lines 442A may extend in the first direction DR1 on the upper surface of the contact gate electrode 440A. The plurality of second conductive lines 442A may function as word lines of the semiconductor memory device.

A capacitor contact 460A may be placed on the channel structure 430A. The capacitor contact 460A may be placed on the second source/drain region SD2, and the capacitor structure 480 may be placed on the capacitor contact 460A.

FIGS. 13 to 22 are intermediate stage diagrams for explaining a method for fabricating a semiconductor memory device according to an embodiment of the present invention.

Figure 13:
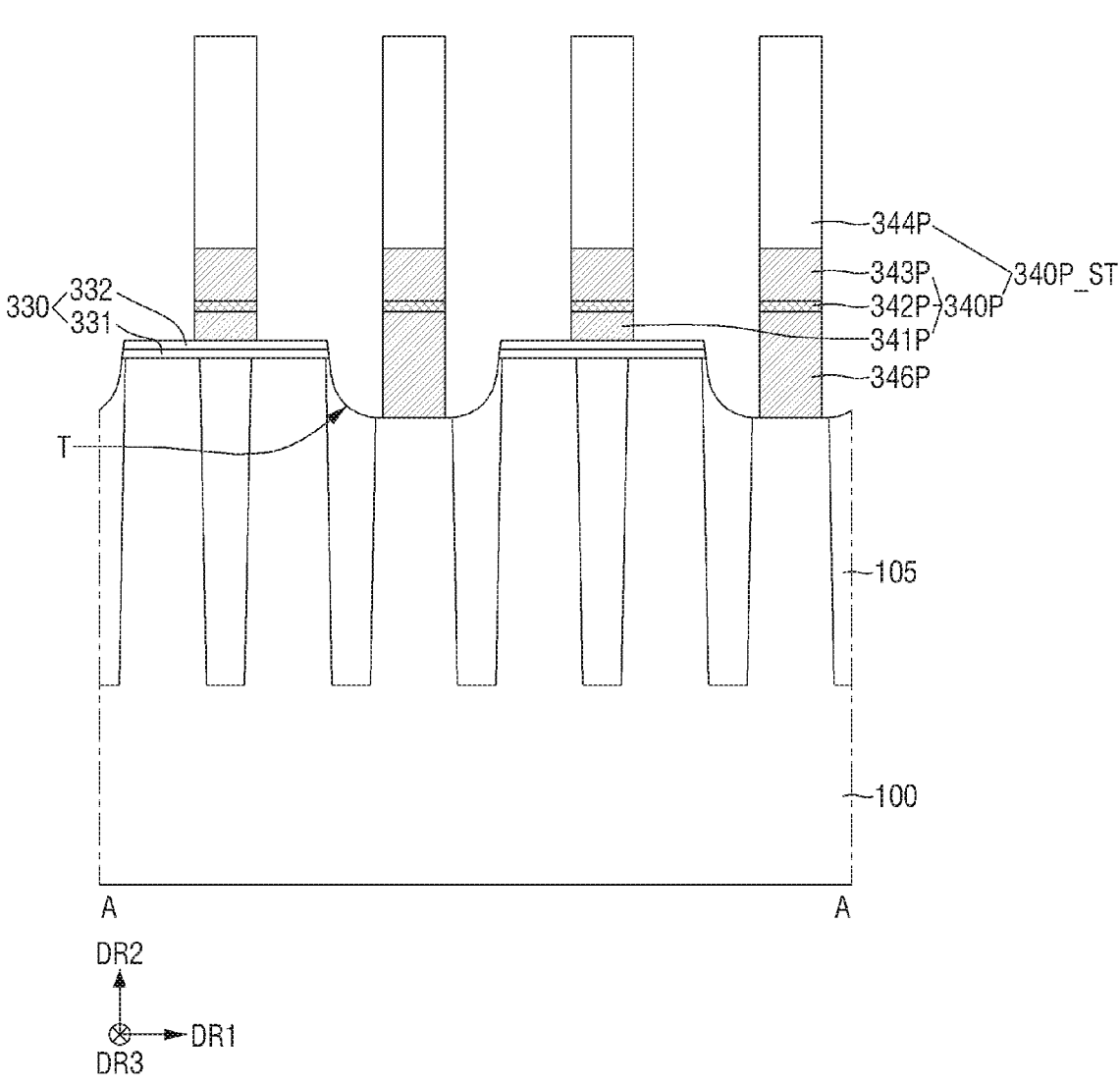

Referring to FIG. 13, first to third pre-conductive films 341P, 342P, and 343P and a pre-capping pattern 344P may be sequentially formed on the substrate 100 and the element isolation film 105. Subsequently, the first to third pre-conductive films 341P, 342P and 343P, the pre-direct contact 346P and the pre-capping pattern 344P may be patterned. The cell insulating film 330 may be formed on the substrate 100 and the element isolation film 105 in which the pre-direct contact 346P is not formed. The cell insulating film 330 may be formed between the substrate 100 and the first pre-conductive films 341P, and between the element isolation film 105 and the first pre-conductive films 341P.

Accordingly, a bit line structure 340ST that extends along the third direction DR3 across the active region (ACT of FIG. 1) and the word line (WL of FIG. 1) may be formed. In an embodiment of the present invention, the width of the bit line structure 340ST and the width of the direct contact 346 may be formed to be smaller than the width of the trench T. That is, the patterned bit line structure 340ST and the patterned direct contact 346 may not completely fill the trench T.

Figure 14:
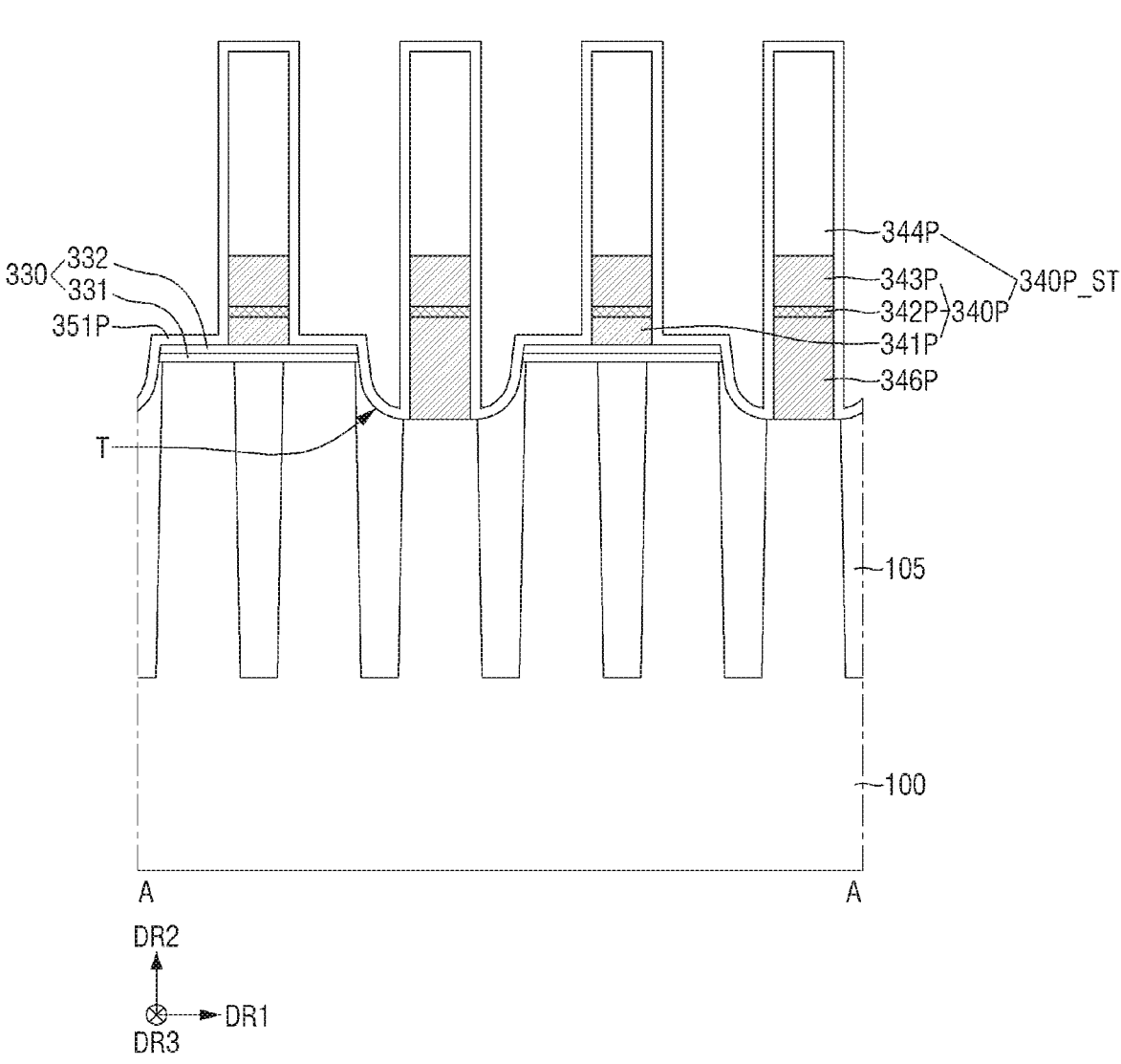

Referring to FIG. 14, a pre-inner spacer film 351P may be formed. The pre-inner spacer film 351P may extend along the side surface and upper surface of the bit line structure 340ST, the side surface of the direct contact 346, the side surface and upper surface of the cell insulating film 330, and the profile of the trench T.

The pre-inner spacer film 351P may include, for example, silicon nitride ($Si_3N_4$). For example, the pre-inner spacer film 351P may be formed by an atomic layer deposition (ALD) process.

Figure 15:
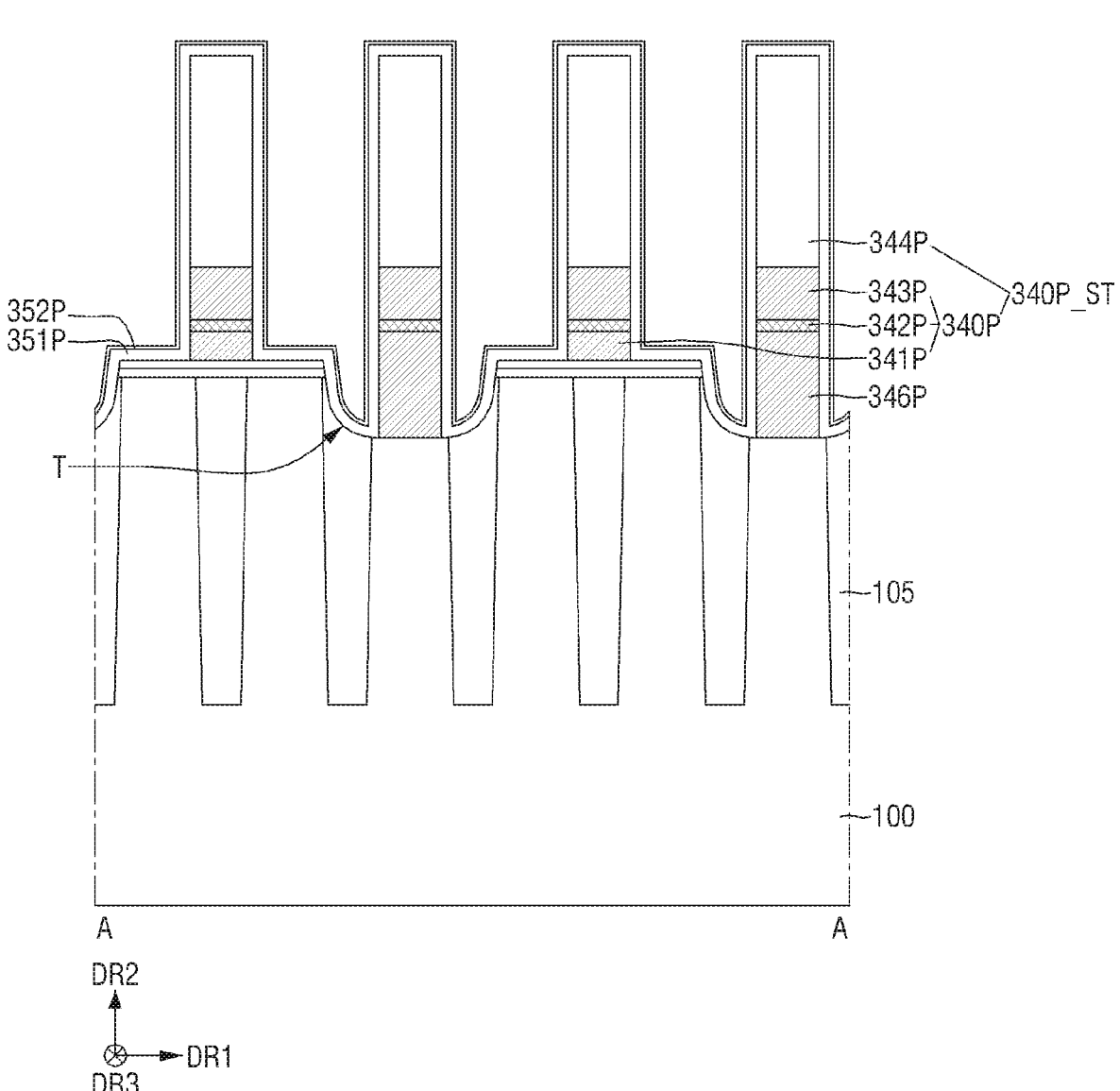

Referring to FIG. 15, a pre-oxide film 352P may be formed.

The pre-oxide film 352P may be formed on the pre-inner spacer film 351P. The pre-oxide film 352P may be conformally formed along the profile of the pre-inner spacer film 351P. The pre-oxide film 352P may extend into the trench T.

The pre-oxide film 352P may include silicon oxide ($SiO_2$). For example, the pre-oxide film 352P may be formed by the atomic layer deposition (ALD) process.

Figure 16:
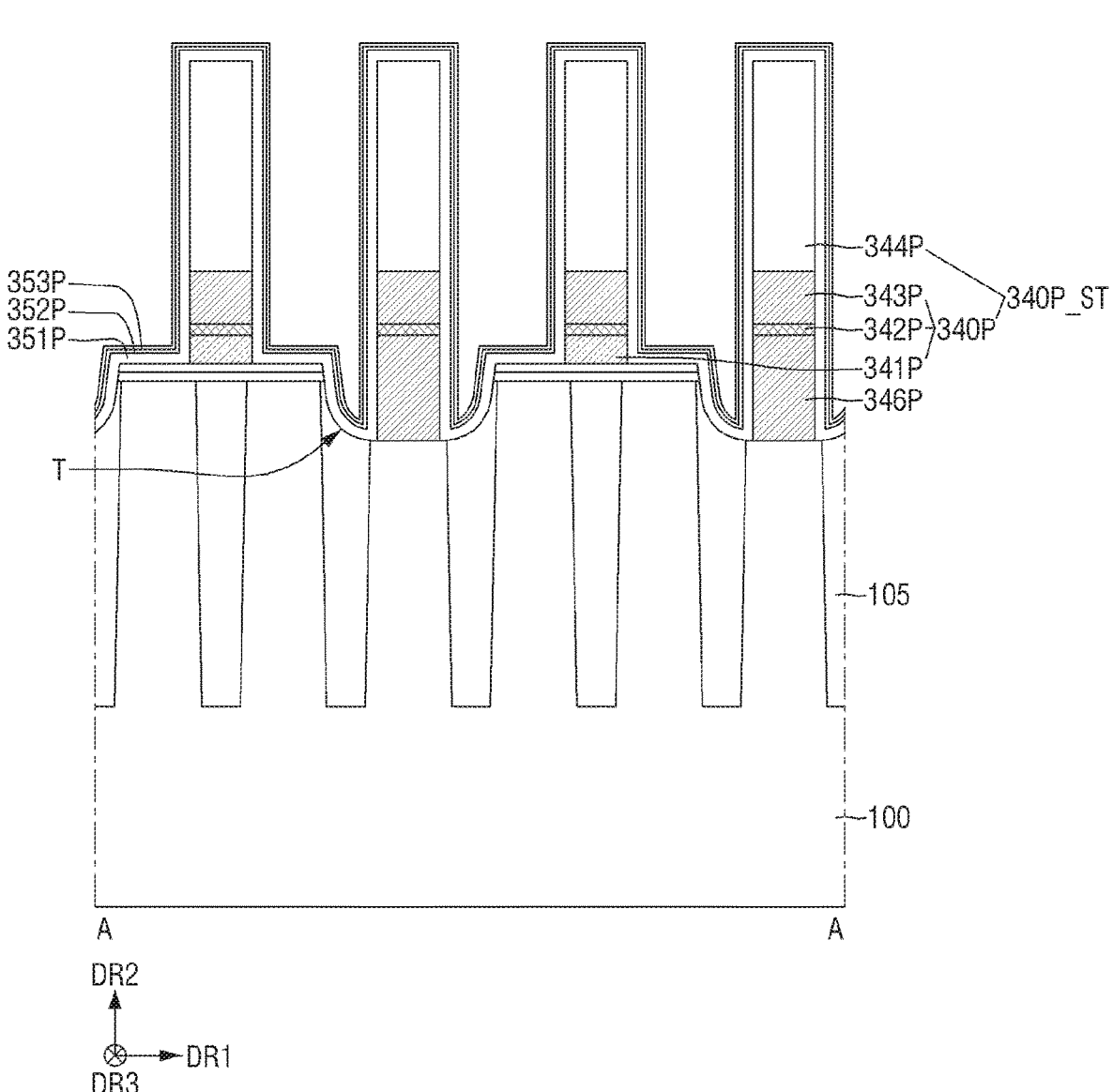

Referring to FIG. 16, a pre-seed layer 353P may be formed.

The pre-seed layer 353P may be formed on the pre-oxide film 352P. The pre-seed layer 353P may be conformally formed along the profile of the pre-oxide film 352P. The pre-seed layer 353P may extend into the trench T. The pre-seed layer 353P may include silicon carbonitride (SiCN).

The pre-seed layer 353P may be formed by the atomic layer deposition (ALD) process. The pre-seed layer 353P may be formed through the atomic layer deposition at a temperature between 400° C. and 700° C. In an embodiment of the present invention, the atomic layer deposition process may be performed at a deposition temperature about 630° C. For example, hexachlorodisilane (HCD, $Si_2Cl_6$) may be provided as a precursor when forming the pre-seed layer 353P. Hexachlorodisilane ($Si_2Cl_6$) may be provided on the pre-oxide film 352P. At least any one of ethene ($C_2H_4$), propene ($C_3H_6$), and acetylene ($C_2H_2$) may then be provided as a reactant gas. Ammonia ($NH_3$) may then be provided as the reactant gas.

A precursor including hexachlorodisilane ($Si_2Cl_6$), a first reactant gas including at least any one of ethene ($C_2H_4$), propene ($C_3H_6$), and acetylene ($C_2H_2$), and a second reactant gas including ammonia ($NH_3$) may be sequentially provided in one cycle. This cycle may be repeated several times. Therefore, the pre-seed layer 353P containing silicon carbonitride (SiCN) may be formed on the pre-oxide film 352P.

Figure 17:
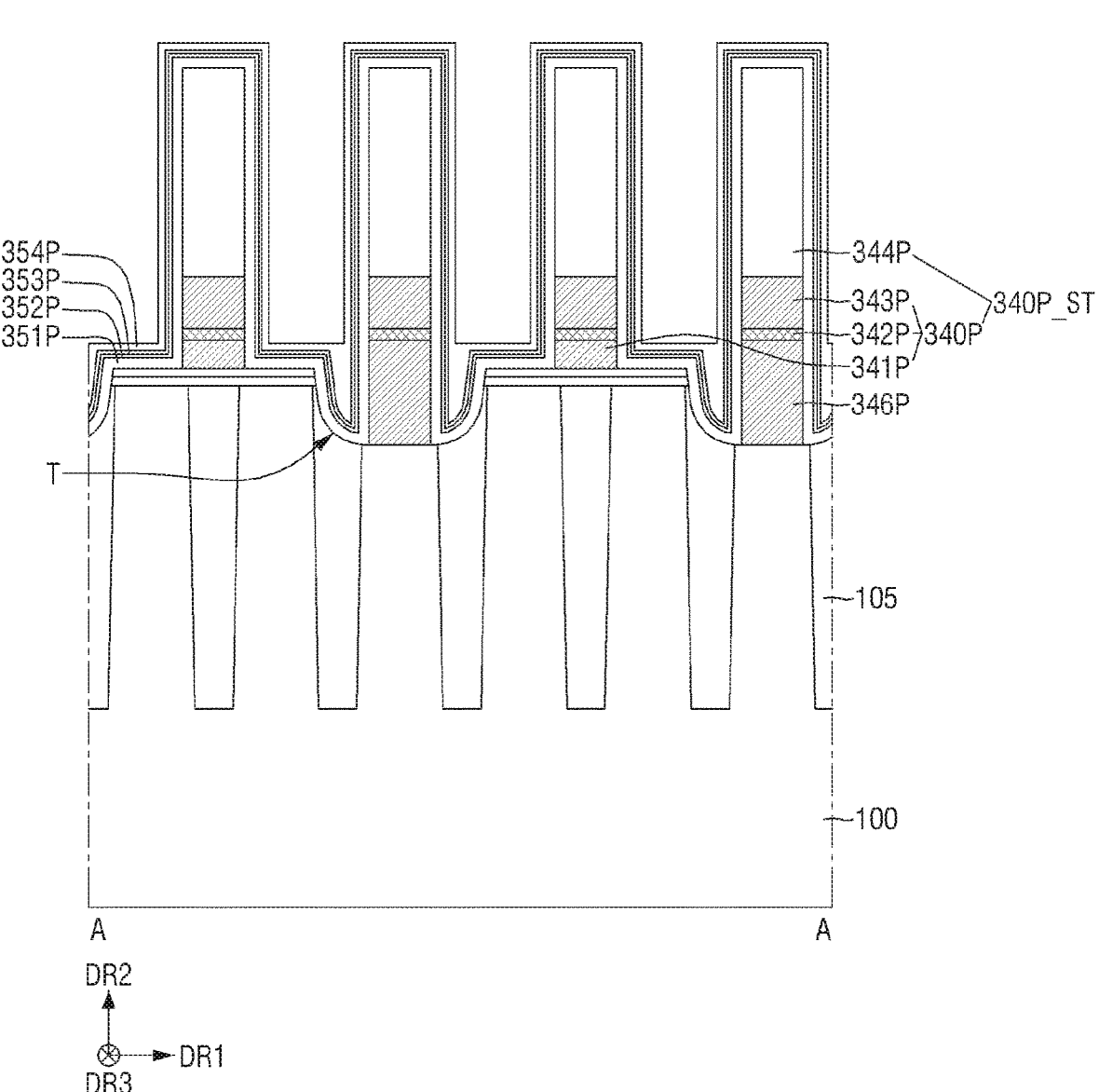

Referring to FIG. 17, a pre-bulk layer 354P may be formed.

The pre-bulk layer 354P may be formed on the pre-seed layer 353P. The pre-bulk layer 354P may fill the trench T. The pre-bulk layer 354P may include silicon nitride ($Si_3N_4$).

Referring to FIGS. 14-17, for example, in an embodiment of the present invention, a first silicon nitride ($Si_3N_4$) film and a silicon oxide ($SiO_2$) film may be sequentially formed on the trench T and a conductive pattern which includes the bit line structure 340ST and the direct contact 346. A pre-seed layer 353P including carbon (C) may be formed on the silicon oxide ($SiO_2$) film. A second silicon nitride ($Si_3N_4$) film, which fills the trench T, may be formed on the pre-seed layer 353P.

The pre-bulk layer 354P may be formed by the atomic layer deposition (ALD) process. The pre-bulk layer 354P may be formed through the atomic layer deposition at a temperature between 400° C. and 700° C. For example, at least any one of dichlorosilane (DCS, $SiH_2Cl_2$), hexachlorodisilane, silane ($SiH_4$), diiodosilane ($SiH_2I_2$), diisoprophylaminosilane (DIPAS) may be used as a precursor, when forming the pre-bulk layer 354P. Ammonia ($NH_3$) may then be provided as a reactant gas. In an embodiment of the present invention, the second silicon nitride ($Si_3N_4$) film (the pre-bulk layer 354P) may be formed by providing a precursor including dichlorosilane (DCS, $SiH_2Cl_2$) and an ammonia ($NH_3$) reactant gas in the atomic layer deposition (ALD) process.

When forming the pre-bulk layer 354P, it may be provided by decomposing ammonia ($NH_3$), using the plasma-enhanced atomic layer deposition (PEALD).

A protective layer may be further formed, before forming the pre-bulk layer 354P on the pre-seed layer 353P. The protective layer may include silicon nitride ($Si_3N_4$). For example, a thermal silicon nitride ($Si_3N_4$) film (e.g., less than 1 nm) as the protective layer may be deposited on the pre-seed layer 353P. The protective layer may minimize the carbon (C) contained in the pre-seed layer 353P from reacting with other materials, while the process proceeds. For example, hydrogen radicals may be used in removing impurities in the process and may react with the carbon (C) contained in the silicon carbonitride (SiCN) layer.

Figure 18:
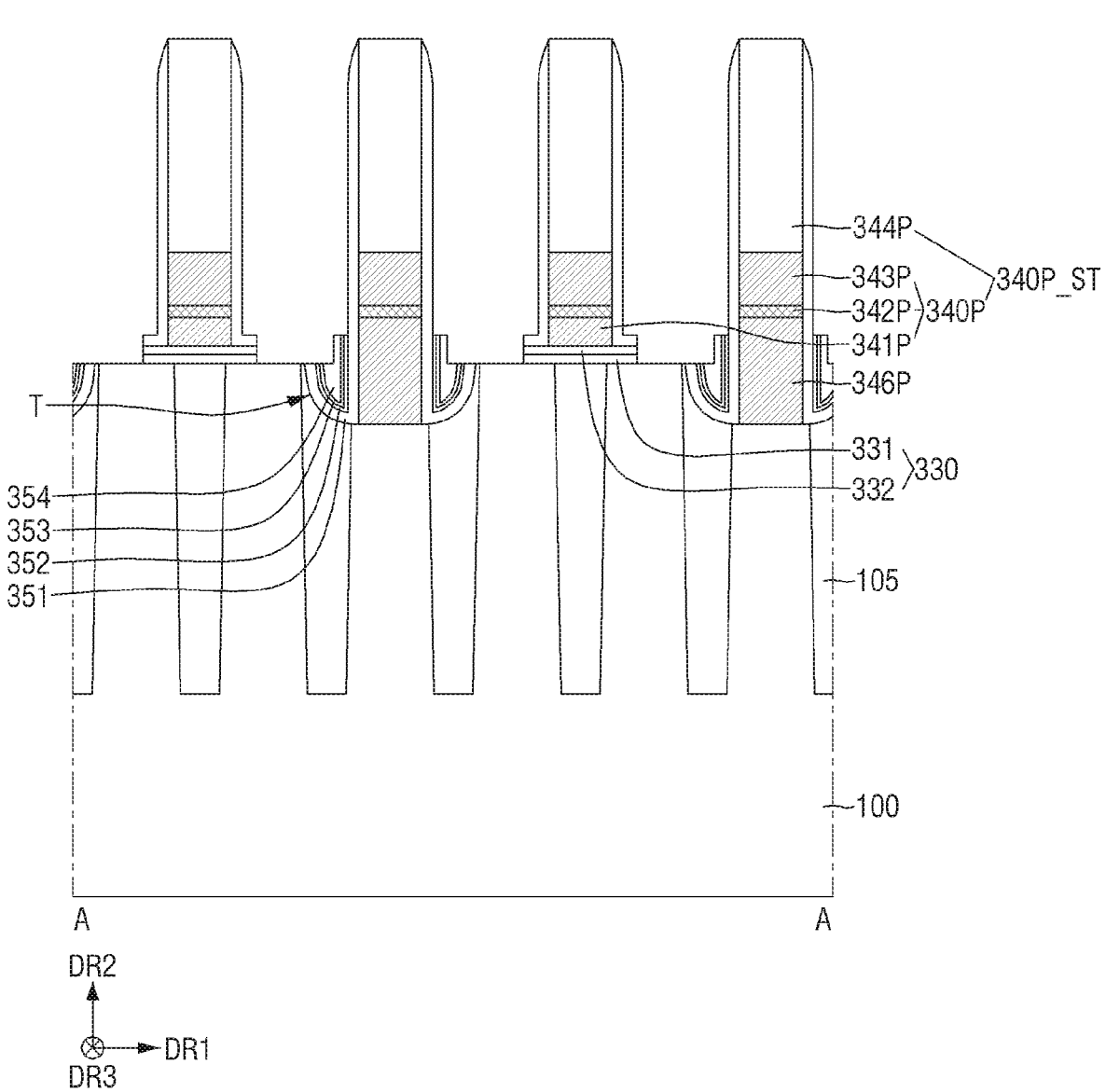

Referring to FIG. 18, the cell insulating film 330, the inner spacer 351, the oxide film 352, the seed layer 353, and the bulk layer 354 may be patterned.

A part of the substrate 100 may be exposed, while patterning the cell insulating film 330, the inner spacer 351, the oxide film 352, the seed layer 353, and the bulk layer 354.

Although FIG. 18 shows that the inner spacers 351 and the bulk layer 354 are patterned to form corners, the present invention is not limited thereto. This is an exemplary diagram, and the forms of the inner spacer 351 and the bulk layer 354 may vary depending on an etching ratio, a process environment, a reactive material, and the like.

Figure 19:
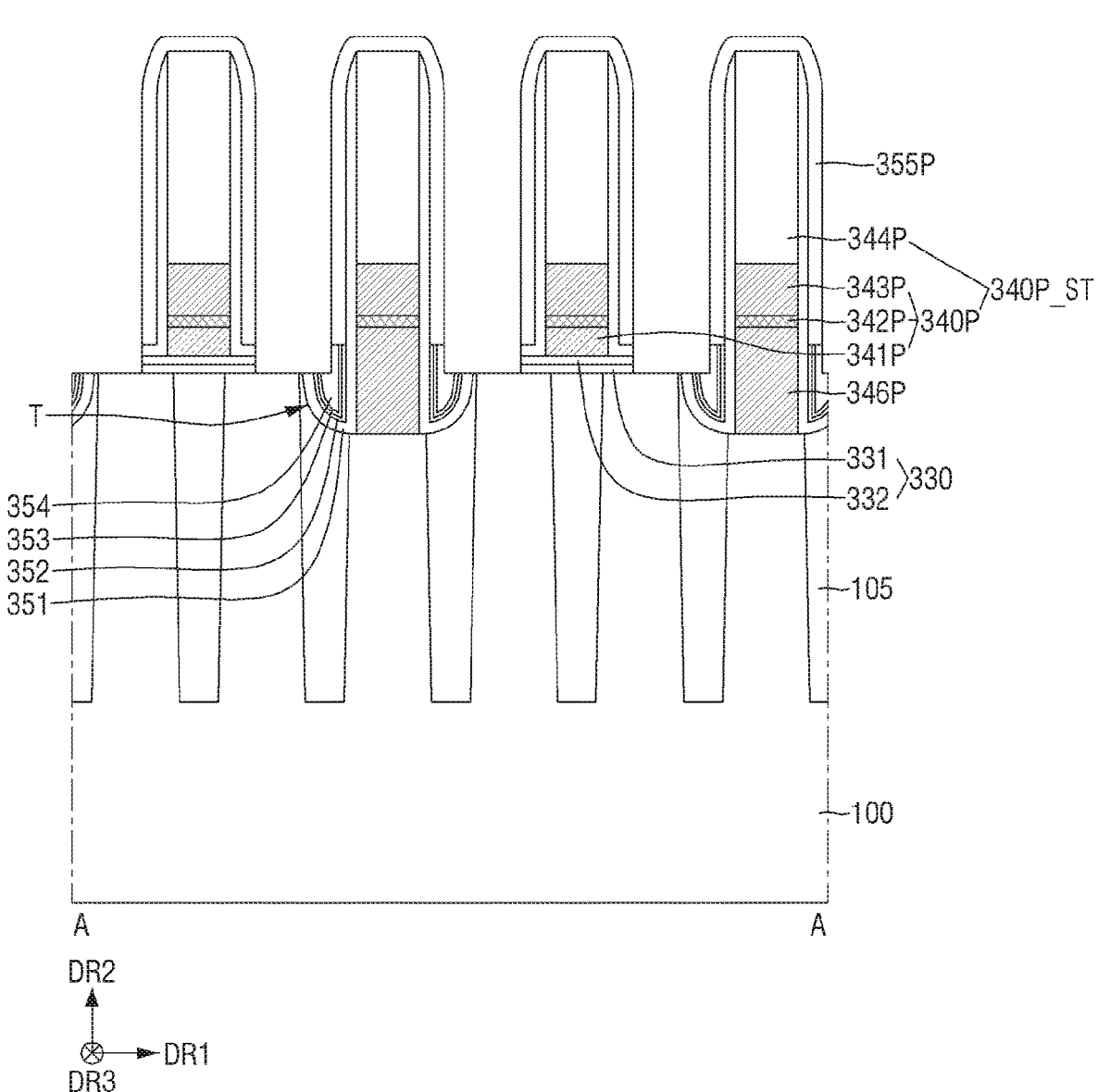

Referring to FIG. 19, a first pre-sub-spacer 355P may be formed.

For reference, FIG. 19 shows a form in which the first pre-sub-spacer 355P is formed on the inner spacer 351, the oxide film 352, the seed layer 353, the bulk layer 354, and the substrate 100 and then partially patterned.

Figure 20:
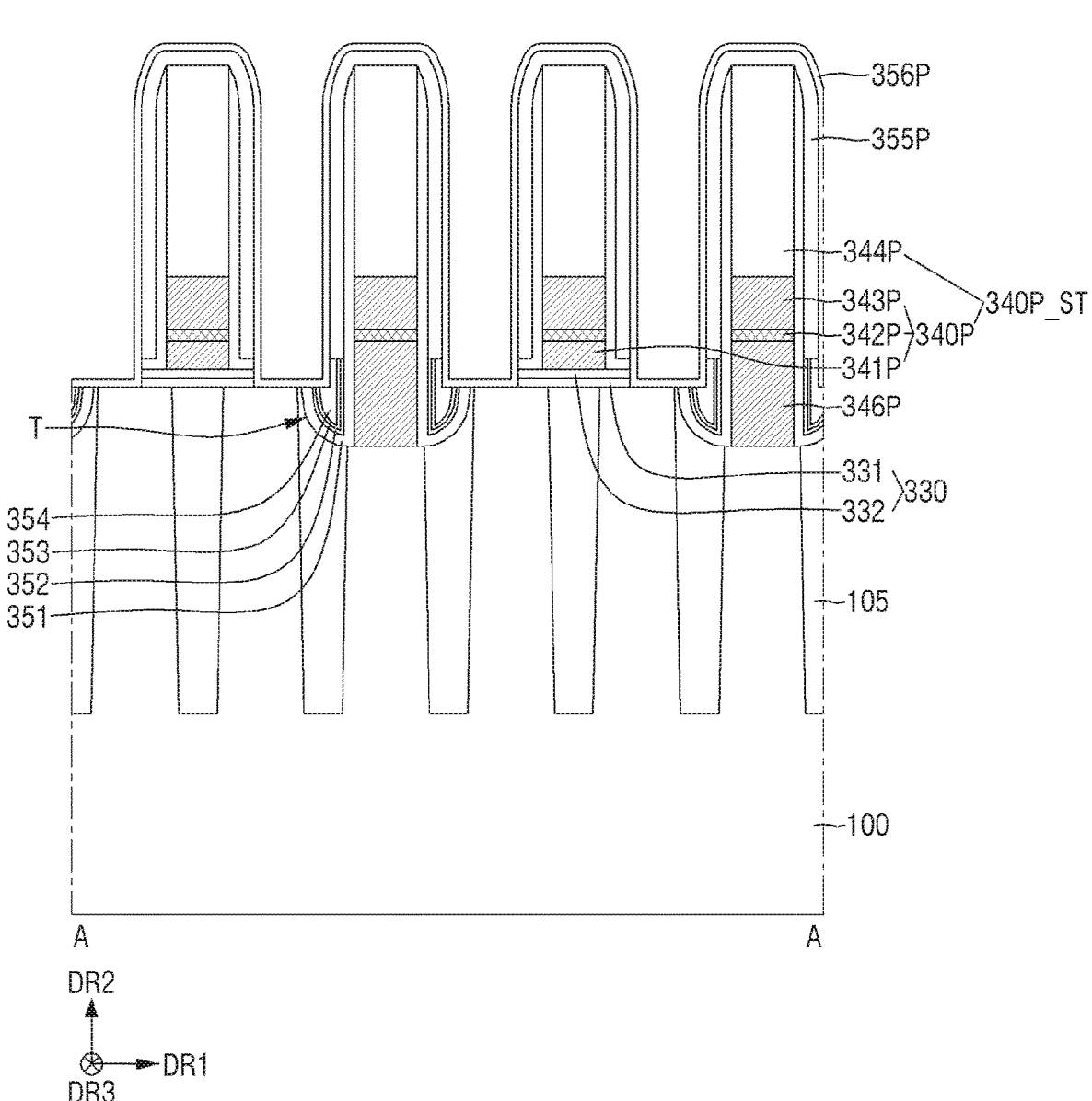

Referring to FIG. 20, a second pre-sub-spacer 356P may be formed.

The second pre-sub-spacer 356P may be formed on the first pre-sub-spacer 355P.

Figure 21:
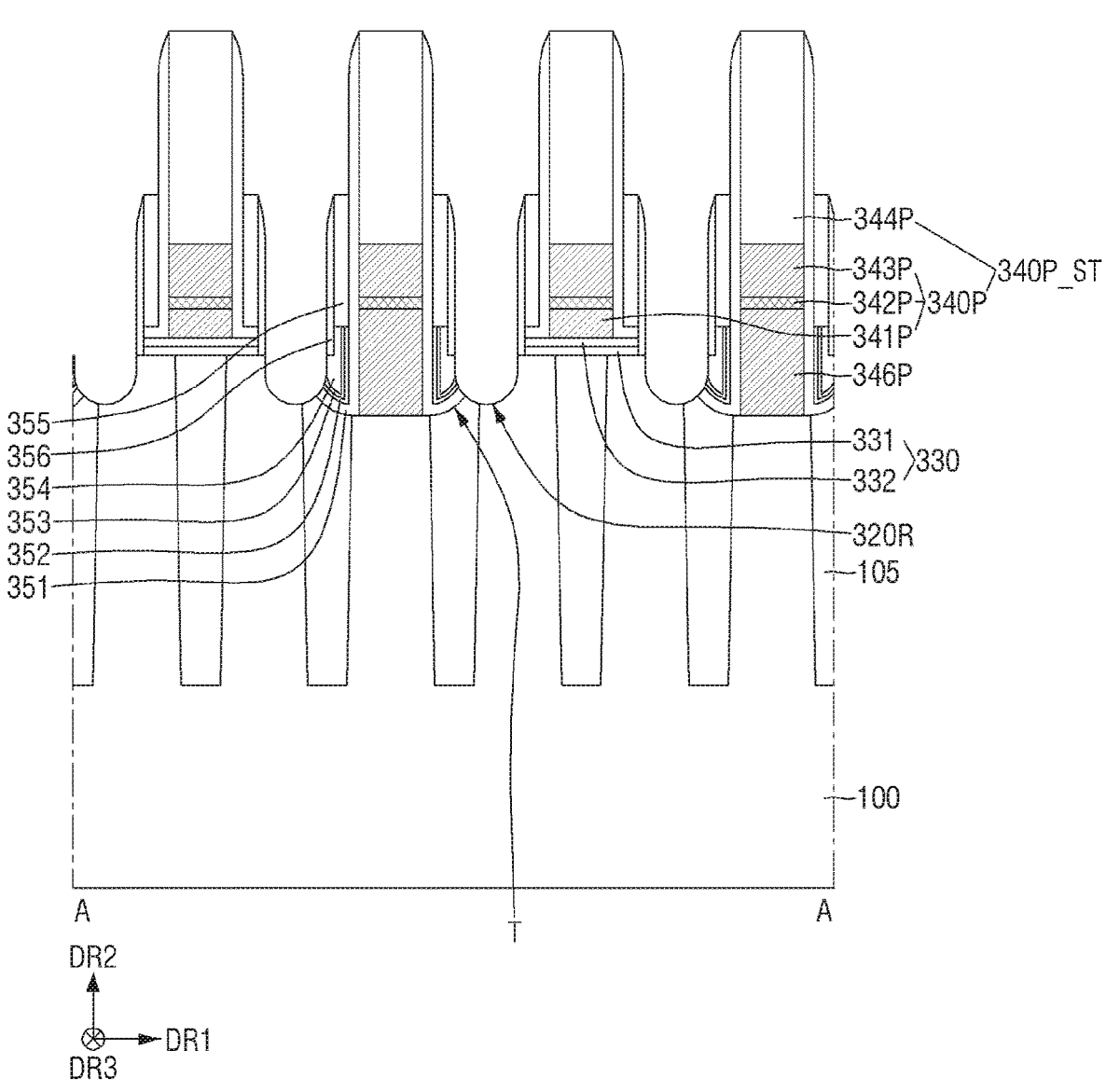

Referring to FIG. 21, a contact recess 320R may be formed.

A lower surface of the contact recess 320R may be formed to be lower than the upper surface of the substrate 100. For example, the contact recess 320R may be formed in the active region of the substrate 100 (ACT of FIG. 1). The contact recess 320R may penetrate the second pre-sub-spacer 356P to expose a part of the substrate 100 and the element isolation film 105.

The first sub-spacer 355 and the second sub-spacer 356 may be formed in the process of forming the contact recess 320R. For example, the first pre-sub-spacer 355P and the second pre-sub-spacer 356P may be patterned in the process of etching for forming the contact recess 320R.

When the contact recess 320R is formed, the inner spacer 351, the bulk layer 354, the seed layer 353 and the oxide film 352 may be partially etched. The seed layer 353 may be formed below the bulk layer 354 to prevent diffusion of oxygen (O) from the oxide film 352 into the bulk layer 354. The bulk layer 354 into which oxygen (O) has not diffused may not be excessively etched when the contact recess 320R is formed.

The oxide film 352 containing oxygen (O) and the seed layer 353 may be easily etched in the process of forming the contact recess 320R and the buried contact 320. When the second vertical portion (352a of FIG. 3) of the oxide film 352 and the third vertical portion (353a of FIG. 3) of the seed layer 353 are etched, and the contact recess 320R is formed closer to the direct contact 346, the direct contact 346 and the buried contact 320 may not be stably separated. In this case, there may be a defect in which the direct contact 346 and the buried contact 320 are electrically connected to each other.

On the other hand, when the contact recess 320R is formed, the third bent portion (353b of FIG. 3) of the seed layer 353 and the second bent portion (352b of FIG. 3) of the oxide film 352 may be preferentially etched. When the third bent portion (353b of FIG. 3) of the seed layer 353 and the second bent portion (352b of FIG. 3) of the oxide film 352 are etched, the bulk layer 354 may be exposed by the contact recess 320R.

Even if the bulk layer 354 is exposed to the contact recess 320R, the bulk layer 354 with reduced oxygen (O) diffusion may not be excessively etched. Thus, the bulk layer 354 may prevent the contact recess 320R from extending to the second vertical portion (352a of FIG. 3) of the oxide film 352 and the third vertical portion (353a of FIG. 3) of the seed layer 353. That is, the contact recess 320R may be stably formed apart from the direct contact 346.

Figure 22:
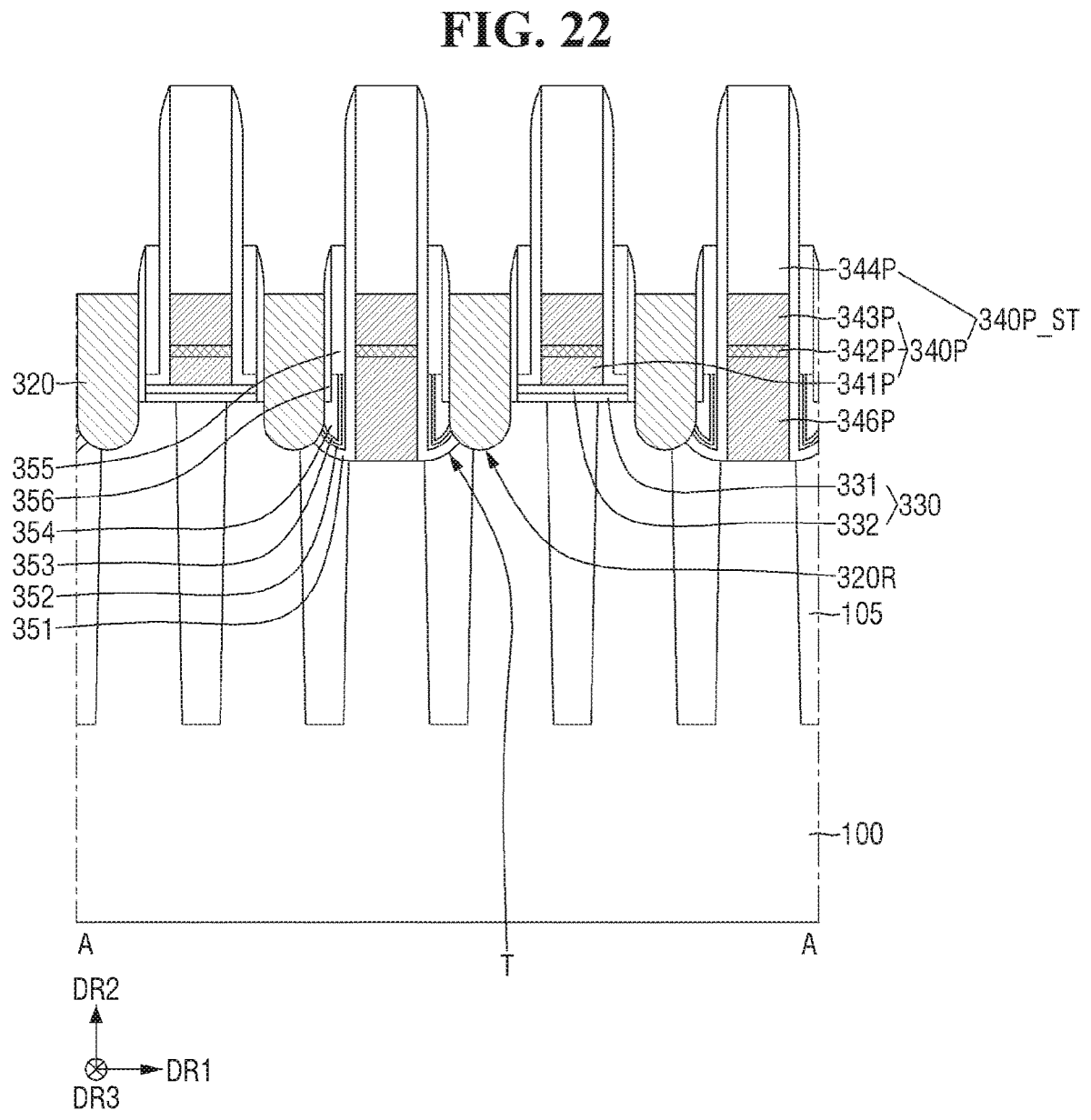

Referring to FIG. 22, the buried contact 320 may be formed inside the contact recess 320R.

The buried contact 320 may be deposited to fill the contact recess 320R. The buried contact 320 may come into contact with the inner spacer 351, the oxide film 352, the seed layer 353 and the bulk layer 354.

Next, referring to FIG. 2, the pre-capping pattern 344P and the inner spacer 351 may be further patterned.

Subsequently, a landing pad 360, a pad isolation insulating film 380, a lower electrode 210, a capacitor dielectric film 220, and an upper electrode 230 may be formed on the buried contact 320. Accordingly, the spacer structure 350 according to an embodiment of the present invention may stably separate the buried contact 320 and the direct contact 346, so that a defect in which the direct contact 346 and the buried contact 320 being electrically connected to each other may be prevented, and thus, a semiconductor memory device having enhanced reliability may be obtained.

In concluding the detailed description, those skilled in the art will appreciate that many variations and modifications may be made to the preferred embodiments without departing from the spirit and scope of the present invention as defined in the appended claims. Therefore, the disclosed preferred embodiments of the present invention are used in a generic and descriptive sense only and not for purposes of limitation.

What is claimed is:

1. A semiconductor memory device comprising:
a substrate including a trench and a contact recess;
a direct contact which is placed inside the trench, and has a width smaller than a width of the trench;
a bit line structure which is placed on the direct contact, and has a width smaller than the width of the trench;
a spacer structure which is placed on side surfaces of the direct contact and the bit line structure; and
a buried contact which is spaced apart from the direct contact and the bit line structure by the spacer structure, and fills the contact recess,
wherein the spacer structure includes:
an oxide film which is placed between the direct contact and the buried contact inside the trench;
a seed layer which is placed on the oxide film and placed inside the trench between the direct contact and the buried contact; and
a bulk layer which fills the trench on the seed layer, and includes silicon nitride,
wherein the seed layer includes carbon.

2. The semiconductor memory device of claim 1, wherein the seed layer includes silicon carbonitride (SiCN).

3. The semiconductor memory device of claim 1, wherein an uppermost end of the seed layer is placed below an uppermost surface of the buried contact.

4. The semiconductor memory device of claim 1, wherein the spacer structure further includes an inner spacer which is placed below the oxide film, and extends along the side surfaces of the direct contact and the bit line structure and a profile of the trench.

5. The semiconductor memory device of claim 4, wherein the inner spacer includes silicon nitride.

6. The semiconductor memory device of claim 4, wherein the spacer structure further includes an outer spacer which is placed on the oxide film, the seed layer and the bulk layer, and placed on a side surface of the inner spacer.

7. The semiconductor memory device of claim 1, wherein the buried contact comes into contact with the seed layer and the bulk layer.

8. The semiconductor memory device of claim 1, wherein the seed layer comes into contact with the oxide film and the bulk layer inside the trench.

9. The semiconductor memory device of claim 1, further comprising:
a capacitor which is placed on the buried contact and electrically connected to the buried contact.

10. The semiconductor memory device of claim 1, wherein a lowermost end of the seed layer is placed below an upper surface of the substrate.

11. The semiconductor memory device of claim 1, wherein the bulk layer includes a void.

12. The semiconductor memory device of claim 1, wherein the seed layer includes:
a first portion which extends along a profile of the side surface of the direct contact; and
a second portion which is bent from the first portion and extends along a profile of the trench.

13. The semiconductor memory device of claim 1, wherein the seed layer does not extend between the bit line structure placed on the direct contact and the buried contact.

14. A semiconductor memory device comprising:
a substrate including a trench and a contact recess;
a direct contact which is placed inside the trench, and has a width smaller than a width of the trench;
a bit line structure which is placed on the direct contact, and has a width smaller than the width of the trench;
a spacer structure which is placed on side surfaces of the direct contact and the bit line structure; and
a buried contact which is spaced apart from the direct contact and the bit line structure by the spacer structure, and fills the contact recess,
wherein the spacer structure includes:
an inner spacer extending along the side surfaces of the direct contact and the bit line structure and a profile of the trench;
an outer spacer extending along a side surface of the inner spacer; and
a lower spacer which is placed between the inner spacer and the outer spacer below the outer spacer, and fills the trench,
wherein the lower spacer includes:
an oxide film; and
a nitride film which is placed on the oxide film and includes carbon.

15. The semiconductor memory device of claim 14, wherein the buried contact comes into contact with the lower spacer.

16. The semiconductor memory device of claim 14, wherein the oxide film of the lower spacer includes:
a first portion extending along the side surface of the inner spacer; and
a second portion extending along the profile of the trench on the inner spacer.

17. The semiconductor memory device of claim 14, wherein the lower spacer is placed between the buried contact and the direct contact, and not placed between the bit line structure and the buried contact above the direct contact.

18. The semiconductor memory device of claim 14, wherein the inner spacer includes silicon nitride.

19. The semiconductor memory device of claim 14, wherein a concentration of carbon of the nitride film of the lower spacer increases toward the oxide film.

20. A semiconductor memory device comprising:
a substrate including a trench and a contact recess;
a direct contact which is placed inside the trench, and has a width smaller than a width of the trench;
a bit line structure which is placed on the direct contact, and has a width smaller than the width of the trench;
a spacer structure which is placed on side surfaces of the direct contact and the bit line structure; and
a buried contact which is spaced apart from the direct contact and the bit line structure by the spacer structure, and fills the contact recess,
wherein the spacer structure includes:
a first spacer which extends along the side surfaces of the direct contact and the bit line structure and a profile of the trench;
an oxide film which is placed on the first spacer inside the trench and placed between the direct contact and the buried contact;
a seed layer which is placed on the oxide film, and includes carbon;
a bulk layer which fills the trench on the seed layer, and includes silicon nitride; and
a second spacer which extends along a side surface of the first spacer, and is placed on the oxide film, the seed layer, and the bulk layer,
wherein the seed layer and the bulk layer are placed between the direct contact and the buried contact, and not placed between the bit line structure placed on the direct contact and the buried contact,
wherein the seed layer includes:
a first portion which extends along a profile of the side surface of the direct contact; and
a second portion which is bent from the first portion and extends along the profile of the trench, and
wherein the buried contact is not in contact with the first portion of the seed layer, and is in contact with the second portion of the seed layer.

* * * * *